United States Patent
Presgraves et al.

(10) Patent No.: US 8,635,176 B2
(45) Date of Patent: Jan. 21, 2014

(54) SYSTEM TO CREATE AND USE TEST PLANS USABLE IN VALIDATING A REAL WORLD MODEL IN SOFTWARE OF A SAFETY INSTRUMENTED SYSTEM ARCHITECTURE FOR SAFETY INSTRUMENTED SYSTEMS IN A FACILITY

(71) Applicant: Applied Engineering Solutions, Inc, Greenville, SC (US)

(72) Inventors: Carolyn Crosby Presgraves, Anderson, SC (US); John Weldon Kelley, III, Anchorage, AK (US); Michael Dennis Scott, Anchorage, AK (US); Brian Dudley Merriman, Anderson, SC (US); David Martin Busch, Greenville, SC (US)

(73) Assignee: Applied Engineering Solutions, Inc., Greenville, SC (US)

( * ) Notice: Subject to any disclaimer, the term of this patent is extended or adjusted under 35 U.S.C. 154(b) by 0 days.

(21) Appl. No.: 13/889,311

(22) Filed: May 7, 2013

(65) Prior Publication Data

US 2013/0246333 A1 Sep. 19, 2013

Related U.S. Application Data

(63) Continuation-in-part of application No. 13/251,051, filed on Sep. 30, 2011, now Pat. No. 8,521,676.

(60) Provisional application No. 61/388,423, filed on Sep. 30, 2010, provisional application No. 61/388,437, filed on Sep. 30, 2010.

(51) Int. Cl.
*G06F 17/00* (2006.01)
*G06N 5/02* (2006.01)

(52) U.S. Cl.
USPC .......................................................... 706/46

(58) Field of Classification Search
USPC ........................................ 706/46; 700/21, 79
See application file for complete search history.

(56) References Cited

U.S. PATENT DOCUMENTS

| 7,813,820 | B2 | 10/2010 | Opem et al. |
| 2005/0027379 | A1 | 2/2005 | Dyk et al. |
| 2009/0012631 | A1 | 1/2009 | Fuller |
| 2010/0004761 | A1 | 1/2010 | Flanders et al. |
| 2012/0101953 | A1 | 4/2012 | James et al. |

OTHER PUBLICATIONS

Timms, C. et al. "Software Tools for the Lifecycle Suport of Safety Instrumented Systems". TUV International Symposium 2006. pp. 1-14, 2006.
Fonseca, J.A. et al. "CMMI RAMS Extension Based on CENELEC Railway Standard". SAFECOMP 2005, LNCS 3688, pp. 1-12, 2005.

*Primary Examiner* — Jeffrey A Gaffin
*Assistant Examiner* — Benjamin Buss
(74) *Attorney, Agent, or Firm* — Buskop Law Group, PC; Wendy Buskop

(57) ABSTRACT

A system to computer generate, manage, analyze, or combinations thereof, a real world model in software of a safety instrumented system (SIS) architecture for SIS in a facility, and generate test plans, wherein the SIS architecture for SIS in a facility comprises at least one instrumented protective function (IPF) and wherein the test plans support process safety lifecycle management.

60 Claims, 21 Drawing Sheets

FIGURE 1A

COMPONENT LIBRARY 316

| COMPONENT_ID 304 | TAGNAME 320 | COMPONENT TYPE 322 | EQUIPMENT TYPE 324 | NAME 335 | PROCESS DESCRIPTION 337 | ASSET ID 339 | RECONCILING ID 341 |
|---|---|---|---|---|---|---|---|
| 1 | PT-120 | INPUT | PRESSURE TRANSMITTER | PT-120 | SEPARATOR 1 PRESSURE | 1111331 | 778b392 |
| 2 | PS-120 | INPUT | PRESSURE SWITCH | PS-120 | SEPARATOR 1 PRESSURE | 1111332 | 779c461 |
| 3 | PT-122 | INPUT | PRESSURE TRANSMITTER | PT-122 | SEPARATOR 2 PRESSURE | 1111445 | 778b393 |
| 4 | PS-122 | INPUT | PRESSURE SWITCH | PS-122 | SEPARATOR 2 PRESSURE | 1111446 | 779d743 |
| 5 | SIS-100 | LOGIC SOLVER | INDUSTRIAL PLC | SIS-100 | SEPARATOR CONTROL | 1111447 | 780b456 |
| 6 | SDY-120 | OUTPUT | 3 WAY SOLENOID | SDY-120 | SEPARATOR 1 OUTLET VALVE | 1111551 | 785c357 |
| 7 | SDV-120 | OUTPUT | BALL VALVE | SDV-120 | SEPARATOR 1 OUTLET VALVE | 1111552 | 786b393 |
| 8 | SDY-122 | OUTPUT | 3 WAY SOLENOID | SDY-122 | SEPARATOR 2 OUTLET VALVE | 1111771 | 785d358 |
| 9 | SDV-122 | OUTPUT | BALL VALVE | SDV-122 | SEPARATOR 2 OUTLET VALVE | 1111772 | 786d394 |

FIGURE 1B

ASSEMBLY LIBRARY 308

| ASSEMBLY_ID 302 | NAME 312 | ASSEMBLY TYPE 314 | PROCESS DESCRIPTION 323 | LOCATION 325 | CALCULATED PFD 327 | OVERRIDE 329 | DOCUMENT ID 331 | OVERT FAULT STATUS 333 |
|---|---|---|---|---|---|---|---|---|
| 10 | PS-120 | INPUT | SEPARATOR 1 PRESSURE | 10 | .0001 | FALSE | 113 | ZERO |
| 20 | PS-122 | INPUT | SEPARATOR 2 PRESSURE | 10 | .001 | FALSE | 114 | ZERO |
| 30 | SDV-120 | OUTPUT | SEPARATOR 1 OUTLET VALVE | 10 | .0001 | FALSE | 115 | CLOSED |
| 40 | SDV-122 | OUTPUT | SEPARATOR 2 OUTLET VALVE | 10 | .001 | FALSE | 117 | CLOSED |

FIGURE 1C

LOGIC SOLVER LIBRARY 309

| LOGIC SOLVER_ID | LOGIC SOLVER LOCATION | NAME | DESCRIPTION | PFD | TESTING INTERVAL |
|---|---|---|---|---|---|
| 1151 | 10 | CPL-1132 | COMPRESSOR 1 CONTROL PANEL | .000001 | 36 |
| 1152 | 10 | CPL-113 | COMPRESSOR 2 CONTROL PANEL | .000001 | 36 |
| 101 | 10 | SIS-17 | SEPARATOR 1 SAFETY PANEL | .000001 | 12 |
| 102 | 10 | SIS-18 | SEPARATOR 2 SAFETY PANEL | .000001 | 12 |

ASSEMBLY - COMPONENT RELATIONSHIP TABLE 300

| ASSEMBLY_ID | COMPONENT_ID | PURPOSE | LOGIC SOLVER |
|---|---|---|---|
| 10 | 1 | SENSOR | NULL |
| 10 | 2 | INTERFACE | 101 |
| 20 | 3 | SENSOR | NULL |
| 20 | 4 | INTERFACE | 102 |
| 30 | 6 | INTERFACE | 101 |
| 30 | 7 | FINAL ELEMENT | NULL |
| 40 | 8 | INTERFACE | 101 |
| 40 | 9 | FINAL ELEMENT | |

ASSEMBLY GROUP LIBRARY 342

| ASSEMBLY GROUP_ID 344 | NAME 346 | VOTING INSTRUCTION 348 | TEST INTERVAL 349 | CALCULATED ASSEMBLY GROUP FAILURE 351 | DOCUMENT ID 331 | GROUP TYPE 360 |
|---|---|---|---|---|---|---|
| 100 | TEST SEPARATOR PRESSURE | 2oo2 | 12 | .0001 | 114 | INPUT |
| 200 | TEST SEPARATOR INLET | 1oo2 | 12 | .001 | 115 | OUTPUT |

FIGURE 2B

ASSEMBLY GROUP - ASSEMBLY RELATIONSHIP TABLE 332

| ASSEMBLY GROUP_ID 344 | ASSEMBLY_ID 302 | ASSEMBLY PARAMETER_ID 352 | ASSEMBLY PARAMETER VALUE 356 | ASSEMBLY PARAMETER VALUE 358 |
|---|---|---|---|---|
| 100 | 10 | 11 | 150 | PSIG |
| 100 | 20 | 12 | 150 | PSIG |
| 200 | 30 | 13 | DEN | |
| 200 | 40 | 14 | DEN | |

FIGURE 3A

INSTRUMENTED PROTECTIVE FUNCTION (IPF) LIBRARY 372

| IPF_ID 374 | NAME 376 | INPUT GROUP VOTING 378 | OUTPUT GROUP VOTING 380 | DOCUMENT ID 331 | CALCULATED INSTRUMENTED PROTECTIVE FUNCTION PROBABILITY OF FAILURE 381 | ACTUATOR TO PERMIT OVERRIDE 383 | PREFERENCE SELECTIONS 385 |
|---|---|---|---|---|---|---|---|
| 1000 | TEST SEPARATOR HIGH PRESSURE INTERLOCK | 1oo1 | 1oo1 | 113 | .0048 | FALSE | 1001_PREF_02 |
| 1010 | TEST SEPARATOR HIGH LEVEL INTERLOCK | 1oo2 | 1oo2 | 114 | .00067 | FALSE | 1010_PREF_04 |
| 1020 | GLYCOL HEATER HIGH TEMP SHUTDOWN | 1oo2 | 1oo2 | 115 | .0035 | FALSE | 1020_PREF_05 |
| 1030 | GLYCOL HEATER LOSS OF FLAME INTERLOCK | 1oo4 | 1oo2 | 117 | .0008 | TRUE | 1030_PREF_06 |

FIGURE 3B

INSTRUMENTED PROTECTIVE FUNCTION (IPF) - ASSEMBLY GROUP RELATIONSHIP TABLE 362

| IPF_ID 374 | ASSEMBLY GROUP_ID 344 | RELATIONSHIP_ID 375 | ADDITIONAL ACTION 386 |
|---|---|---|---|
| 1000 | 100 | 10001 | FALSE |
| 1000 | 200 | 10001 | FALSE |
| 1010 | 500 | 10001 | TRUE |
| 1010 | 510 | 10002 | TRUE |
| 1010 | 520 | 10003 | FALSE |
| 1010 | 530 | 10004 | TRUE |
| 1020 | 550 | 10004 | TRUE |
| 1020 | 551 | 10004 | FALSE |
| 1020 | 552 | 10005 | FALSE |

FIGURE 3C

DOCUMENT LIBRARY 299

| DOCUMENT_ID 331 | DOCUMENT TYPE 353 | DOCUMENT NAME 355 | DOCUMENT DESCRIPTION 357 |
|---|---|---|---|
| 114 | CAUSE AND EFFECT | SEPARATOR 1 CAUSE AND EFFECT | INLET SEPARATOR 1 CAUSE AND EFFECT |
| 115 | CAUSE AND EFFECT | SEPARATOR 2 CAUSE AND EFFECT | INLET SEPARATOR 2 CAUSE AND EFFECT |
| 116 | CAUSE AND EFFECT | COMPRESSOR 1 CAUSE AND EFFECT | COMPRESSOR 1 CAUSE AND EFFECT |
| 117 | CAUSE AND EFFECT | COMPRESSOR 2 CAUSE AND EFFECT | COMPRESSOR 2 CAUSE AND EFFECT |

FIGURE 3D

LIBRARY OF PUBLICATIONS 301

| STATUTES 290 | INDUSTRY STANDARDS 291 | NATIONAL REGULATIONS 292 | BUSINESS OWNER SPECIFIC POLICIES 293 |
|---|---|---|---|
| 35 USC 101 | IEC - 69205 | 37 CFR 25.1 | DO NOT USE HITACHI VALUES |

FIGURE 7A

| (logo) | | Assembly Test Plan for LS-182 | |
|---|---|---|---|
| Facility | | Assembly Name (721) | Test Plan Name (724) |
| AE Solutions-Safety Lifecycle Management-North America-AK-Anchorage Facility1(Anchorage Office Facility1) | | LS-182 | Procedure_High Level Non Bridle Tank Level |
| Module | | | |
| Anchorage Facility1 | | | |

Process Description

Test Separator High Level

| Test Plan Status | Approved By | Approval Date | Comp Tag Name | Comp Name | Fail Mode |
|---|---|---|---|---|---|
| ASBUILT | None | 7/4/2010 12:00 AM | LS-182 | LS-182 | |

Work Requirements

| Required Permits | Policy & Specifications | Personnel | Tools & Instruments |
|---|---|---|---|
| Defeated Safety Device Log | Safety Handbook | Control Room Op | Field Radios |
| | Failure Classification Specification | I&T | Test Pressure Gauge |
| | | | Process Pressure Gauges (2) |

Drawings and Documents for Reference

| DRAWINGS | | DOCUMENTS | |
|---|---|---|---|
| Drawing Type | Drawing No | Document Type | Document No |
| P&ID | MI-0005-001 | C&E | CE_GEN1_54 |
| MI-0005-001 | | Module 71 | |

Assembly Parameters/Threshold Limits

| Parameter Type | Value | Lower Limit | Upper Limit | Units | Approach | Logic Action | As Found |
|---|---|---|---|---|---|---|---|
| LSHH | 48 | 45 | 51 | IN | Inc | | |
| Type Effect | Type Alarm | Alarm Name | | Alarm Tag | | Alarm Point | As Left |
| Trip | | | | | | | |

Comments about assembly LS-182:

Test Separator High Level

Test Results

If the device passes the test, place a check in the box under PASS below. If the device fails the test, place a check in the box under FAIL SAFE or FAIL DANGEROUS below, and record the classification code for the failure in Fail Code box. See the Failure Classification Specification document in the Policies and Specifications of the Test Requirements section above for the defined fail codes.

| Parameter Type | PASS | FAIL SAFE | FAIL DANGEROUS | FAIL CODE | Field Notes: |

| | LSHH | ☐ | ☐ | ☐ | | |
|---|---|---|---|---|---|---|
| | Alarm | | | | | |
| | | ☐ | ☐ | ☐ | | |

740

| TEST PERSONNEL SIGN-OFF | | | TEST PROCEDURE APPROVAL | | |
|---|---|---|---|---|---|
| Department | Test Person | Test Date | Department | Verifing Person | Verifi Date |
| I&T | I&T | mm/dd/yyyy | Operations | Control Room Op | mm/dd/yyyy |
| | | | | | |

Detail Information and Steps to Execute

| Task | Step | Staff | √ | Work Method Steps |
|---|---|---|---|---|
| | | | | Procedure_High Level Non Bridle Tank Level - Work Methods for Testing: LS-182 |
| 1 | | | | *PRE-TEST -* |
| | 1 | | ☐ | Obtain the appropriate permits for the testing and provide the proper notifications to operating personnel regarding the testing, any special requirements, and subsequent alarms that may be generated. |
| | 2 | | ☐ | Verify that any special safety procedures associated with testing or the actions required during testing have been identified and are being followed. |
| | 3 | | ☐ | Verify any required personal protection equipment (PPE) required for the testing is available and in good condition. |
| 3 | | | | *TEST -* |
| | 1 | | ☐ | Coordinate and communicate with operations to install the bypasses (software, hardware switches, jumpers, etc.,) listed in the Trip Prevention Details in the document section if required in order to prevent process upset upon trip. |
| | 2 | | ☐ | Record the method used to verify the state change below. (IT) Verification Method: LS-182 |

| Tester Comments - Additional Steps | Observed Deficiencies and Corrective Actions |
|---|---|
| | |
| | |
| | |

Facility Asset/Maintenance Management System — 800

| Tag Name | Field Trip Point | Field Trip Units | Test Date | Test Result | Interval (Since Last Test) |
|---|---|---|---|---|---|
| PS-120 | 140 | PSIG | 1/12/2007 | Pass | 0 |
| PS-120 | 140 | PSIG | 1/12/2008 | Fail | 12 |
| PS-120 | 145 | PSIG | 11/13/2009 | Pass | 11 |
| PS-120 | 145 | PSIG | 1/13/2010 | Pass | 14 |

Failure Rate = 1/26280 hr — 850

FIGURE 8B

Assembly Data Used for SIL Calc — 826

| Assembly_Id | Tag Name | ParameterID | Trip Point | Trip Units | Test Interval (Months) | Failure Rate |
|---|---|---|---|---|---|---|
| 10 | PS-120 | 11 | 150 | PSIG | 12 | 1/32,000 hr |
| 20 | PS-122 | 12 | 150 | PSIG | 12 | 1/32,000 hr |
| 30 | SDV-120 | 13 | DEN | | 12 | 1/24,000 hr |
| 40 | SDV-122 | 14 | DEN | | 12 | 1/24,000 hr |

FIGURE 10A

| | |
|---|---|
| DATA STORAGE | 14 |
| COMPUTER INSTRUCTIONS FOR FORMING A COMPONENT LIBRARY | 16 |
| COMPUTER INSTRUCTIONS FOR FORMING AN ASSEMBLY LIBRARY | 18 |
| COMPUTER INSTRUCTIONS FOR MATCHING THE GENERATED TEST PLAN TEMPLATE TO AN ASSEMBLY TYPE BY SELECTING ONE GENERATED TEST PLAN TEMPLATE NAME FOR EACH ASSEMBLY TYPE IN THE ASSEMBLY LIBRARY | 20 |
| COMPUTER INSTRUCTIONS FOR FORMING AN ASSEMBLY-COMPONENT RELATIONSHIP TABLE | 22 |
| COMPUTER INSTRUCTIONS FOR FORMING AN ASSEMBLY GROUP LIBRARY | 26 |
| COMPUTER INSTRUCTIONS FOR FORMING AN ASSEMBLY GROUP - ASSEMBLY RELATIONSHIP TABLE | 30 |
| COMPUTER INSTRUCTIONS FOR FORMING A LIBRARY OF INSTRUMENTED PROTECTIVE FUNCTIONS (IPF) | 32 |
| COMPUTER INSTRUCTIONS FOR FORMING AN INSTRUMENTED PROTECTIVE FUNCTION (IPF) - ASSEMBLY GROUP RELATIONSHIP TABLE | 34 |
| COMPUTER INSTRUCTIONS FOR ANALYZING FUNCTIONAL RELATIONSHIPS BETWEEN ASSEMBLY GROUPS AND ASSEMBLIES | 35 |
| COMPUTER INSTRUCTIONS FOR CREATING A TAG BASED MODEL WITH TAGS AND VOTING INSTRUCTIONS | 36 |
| COMPUTER INSTRUCTIONS FOR ADDING FUNCTIONAL SPECIFICATION OF THE INSTRUMENTED PROTECTIVE FUNCTION (IPF) FOR THE FACILITY IN REAL TIME, WHEREIN REAL TIME CAN BE A UNIT OF TIME THAT CAN BE LESS THAN 14 CALENDAR DAYS | 42 |
| COMPUTER INSTRUCTIONS FOR EXECUTING SIL CALCULATIONS THAT USE PHYSICAL SPECIFICATIONS, VOTING INSTRUCTIONS, AND TEST INTERVAL SPECIFICATIONS TO DETERMINE AN AVERAGE PROBABILITY OF FAILURE ON DEMAND FOR EACH INSTRUMENTED PROTECTIVE FUNCTION (IPF) | 46 |
| FUNCTIONAL SPECIFICATION | 49 |
| PHYSICAL SPECIFICATIONS | 50 |
| COMPUTER INSTRUCTIONS FOR PERMITING A USER TO CHANGE ANY ONE COMPONENT OR THE VOTING INSTRUCTIONS | 56 |
| COMPUTER INSTRUCTIONS FOR PROVIDING A CONNECTION TO TAG BASED ASSETS OF THE FACILITY | 58 |
| LOGIC SOLVER | 60 |
| COMPUTER INSTRUCTIONS FOR FORMING A CAUSE AND EFFECT REPORT USING THE RELATIONSHIP TABLES | 62 |
| TEST PLAN TEMPLATES | 68 |
| COMPUTER INSTRUCTIONS FOR INSTRUCTING THE PROCESSOR TO SELECT A TEST PLAN TEMPLATE BASED ON VOTING INSTRUCTIONS, AND USE PHYSICAL SPECIFICATIONS TO CREATE THE FUNCTIONAL TEST PLAN FOR AN ASSEMBLY, AN ASSEMBLY GROUP, AN IPF, OR COMBINATIONS THEREOF | 74 |

FIGURE 10B

| | |
|---|---|
| COMPUTER INSTRUCTIONS FOR USING THE RELATIONSHIP TABLES TO MATCH COMPONENTS TO COMPONENTS USED IN A FACILITY ASSET MANAGEMENT SYSTEM, COMPONENTS USED IN A FACILITY MAINTENANCE MANAGEMENT SYSTEM, AND COMBINATIONS THEREOF | 76 |
| COMPUTER INSTRUCTIONS FOR USING THE RELATIONSHIP TABLES TO UPDATE FROM THE FACILITY HISTORIAN OF A FACILITY | 91 |
| COMPUTER INSTRUCTIONS FOR UPDATING ALL THE COMPONENT INFORMATION IN THE VARIOUS LIBRARIES SIMULTANEOUSLY | 94 |
| DOCUMENT LIBRARY | 299 |
| ASSEMBLY-COMPONENT RELATIONSHIP TABLE | 300 |
| LIBRARY OF PUBLICATIONS | 301 |
| ASSEMBLY LIBRARY | 308 |
| LOGIC SOLVER LIBRARY | 309 |
| COMPONENT LIBRARY | 316 |
| ASSEMBLY GROUP-ASSEMBLY RELATIONSHIP TABLE | 332 |
| ASSEMBLY GROUP LIBRARY | 342 |
| IPF-ASSEMBLY GROUP RELATIONSHIP TABLE | 362 |
| INSTRUMENTED PROTECTIVE FUNCTION (IPF) LIBRARY | 372 |
| SAFETY INTEGRITY LEVEL (SIL) CALCULATION ENGINE | 379 |
| USER ENTERED ASSUMPTIONS FOR EACH IPF | 382 |
| USER SPECIFIED SAFETY INTEGRITY LEVELS | 384 |
| COMPUTER INSTRUCTIONS TO GENERATE A TEST PLAN TEMPLATE FROM THE TEST PLAN TEMPLATE LIBRARY WHEREIN THE GENERATED TEST PLAN TEMPLATE COMPRISES A COLLECTION OF TASKS AND STEPS FOR AN ASSEMBLY, AN ASSEMBLY PARAMETER, AN ASSEMBLY GROUP, OR COMBINATIONS THEREOF | 387 |
| COMPUTER INSTRUCTIONS TO MATCH THE GENERATED TEST PLAN TEMPLATE TO AN ASSEMBLY TYPE USING AT LEAST ONE OF A PLURALITY OF ASSEMBLY TYPES STORED IN THE ASSEMBLY LIBRARY | 388 |
| COMPUTER INSTRUCTIONS TO DESIGNATE PREFERENCES FOR ASSEMBLY LEVEL TESTING OR ASSEMBLY GROUP LEVEL TESTING, OR COMBINATIONS THEREOF, FOR EACH INSTRUMENTED PROTECTIVE FUNCTION (IPF) USING THE GENERATED TEST PLAN TEMPLATE AND THE INSTRUMENTED PROTECTIVE FUNCTIONS (IPF)S LIBRARY FOR THE FACILITY | 389 |
| COMPUTER INSTRUCTIONS TO GENERATE A TEST PLAN USING THE GENERATED TEST PLAN TEMPLATE, THE DESIGNATED PREFERENCES FOR ASSEMBLY LEVEL TESTING OR ASSEMBLY GROUP LEVEL TESTING, OR COMBINATIONS THEREOF, AND THE ASSEMBLY TYPE, THE ASSEMBLY, THE ASSEMBLY PARAMETER, THE ASSEMBLY GROUP, OR COMBINATIONS THEREOF | 390 |
| COMPUTER INSTRUCTIONS TO GENERATE A TEST SCHEDULE FOR EACH DESIGNATED PREFERENCE USING THE GENERATED TEST PLAN | 391 |
| COMPUTER INSTRUCTIONS TO GENERATE A LOOK AHEAD FORECAST FOR PRESET PERIODS OF TIME FOR EACH DESIGNATED PREFERENCE OR GROUPS OF DESIGNATED PREFERENCES IN THE TEST SCHEDULE | 392 |

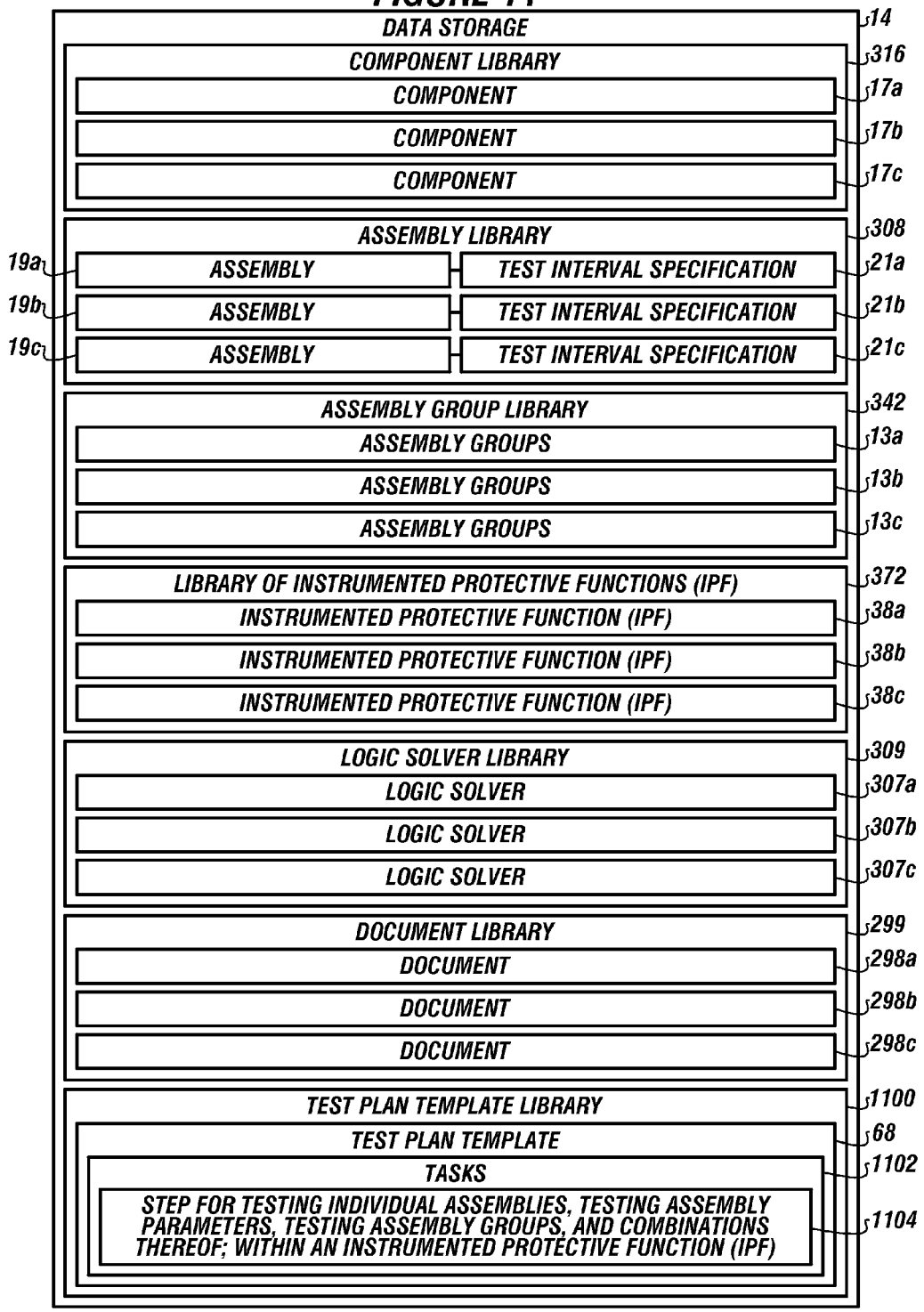

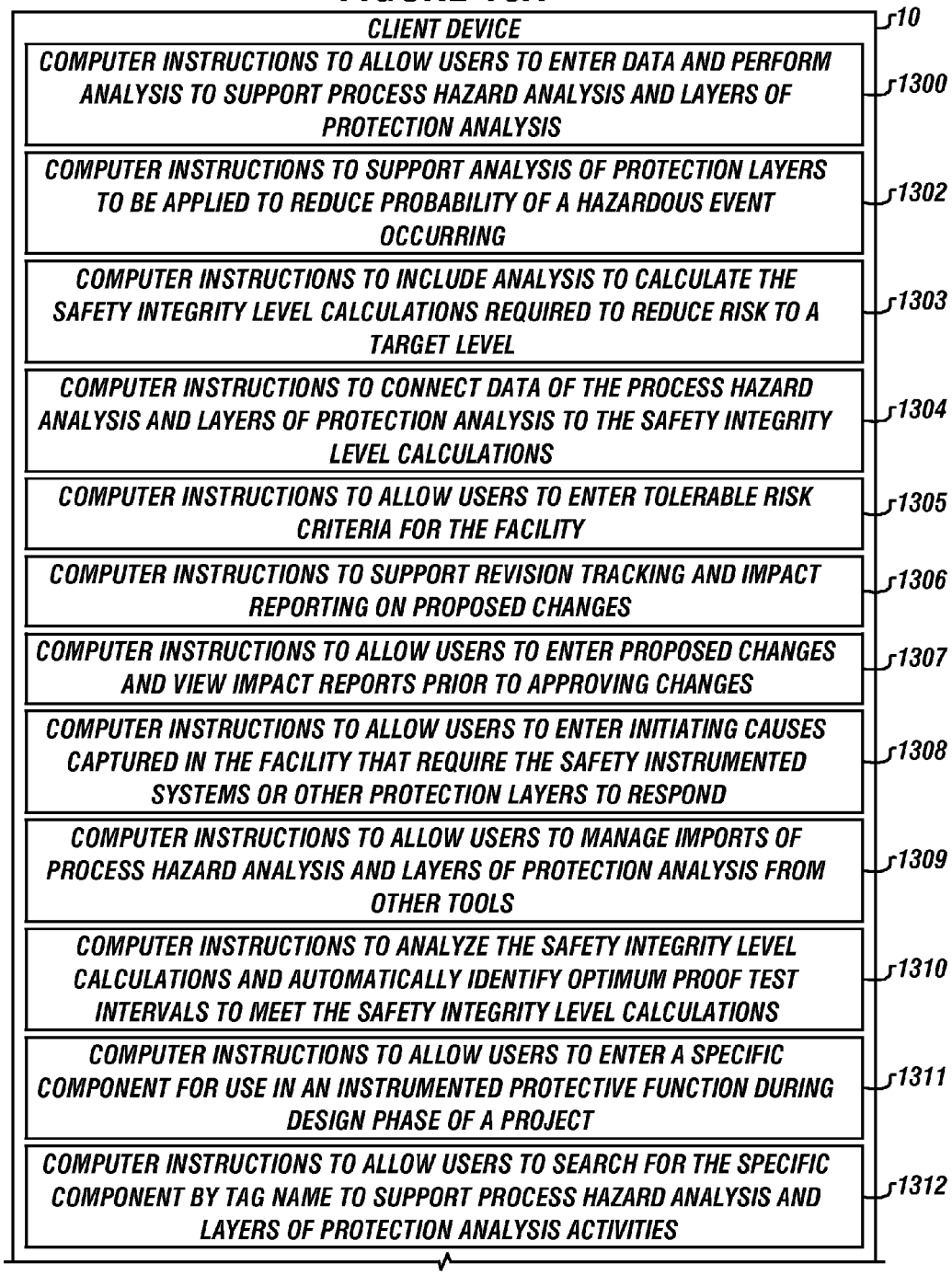

| | |
|---|---|
| COMPUTER INSTRUCTIONS TO GENERATE FACILITY ACCEPTANCE TESTS USING A SOFTWARE MODEL OF PHYSICAL AND FUNCTIONAL SPECIFICATIONS | 1326 |
| SOFTWARE MODEL OF PHYSICAL AND FUNCTIONAL SPECIFICATIONS | 1327 |
| COMPUTER INSTRUCTIONS TO GENERATE SITE ACCEPTANCE TESTS USING THE SOFTWARE MODEL OF PHYSICAL AND FUNCTIONAL SPECIFICATIONS | 1328 |
| COMPUTER INSTRUCTIONS TO GENERATE FUNCTIONAL TEST PLANS FOR EACH SAFETY INSTRUMENTED FUNCTION OF THE INSTRUMENTED PROTECTIVE FUNCTION | 1329 |
| COMPUTER INSTRUCTIONS TO GENERATE A CRITICAL ALARM LIST INCLUDING RISK RANKING OF HAZARDS TO WHICH ALARMS APPLIES | 1330 |
| COMPUTER INSTRUCTIONS TO GENERATE A REPORT OF TEST PERFORMANCE FOR CRITICAL ALARMS | 1331 |
| COMPUTER INSTRUCTIONS TO GENERATE A REPORT SHOWING IMPACT OF BYPASSING ON A RISK GAP BEING OPENED BY PLACING EQUIPMENT IN BYPASS | 1332 |
| COMPUTER INSTRUCTIONS TO CATEGORIZE FAILURES FORM FAILURE RATE ANALYSIS AND PROVIDE STATISTICALLY ANALYZED FAILURE RATES TO BE USED IN SAFETY INTEGRITY LEVEL CALCULATIONS | 1333 |
| COMPUTER INSTRUCTIONS TO ALLOW USERS TO SELECT WHICH SET OF RELIABILITY DATA THEY WANT TO USE | 1334 |
| RELIABILITY LIBRARY | 1335 |
| COMPUTER INSTRUCTIONS AND SYSTEM ARCHITECTURE TO SUPPORT MANAGEMENT OF CHANGE (MOC) OF DATA RECORDS | 1336 |
| COMPUTER INSTRUCTIONS THAT PERMIT A USER TO CHANGE ANY ONE COMPONENT, ONE ASSEMBLY, ONE ASSEMBLY GROUP, OR COMBINATIONS THEREOF OR THE VOTING INSTRUCTIONS OF A TAG BASED SOFTWARE MODEL | 1338 |
| COMPUTER INSTRUCTIONS THAT PROVIDE A CONNECTION TO TAG BASED ASSETS OF THE FACILITY THAT ALLOWS TRANSFER OF DATA FROM TAG BASED ASSETS TO THE DATA STORAGE ASSOCIATED WITH THE PROCESSOR | 1340 |
| COMPUTER INSTRUCTIONS TO USE RELATIONSHIP TABLES AND LIBRARIES TO FORM A CAUSE AND EFFECT REPORT | 1342 |

FIGURE 13C

SYSTEM TO CREATE AND USE TEST PLANS USABLE IN VALIDATING A REAL WORLD MODEL IN SOFTWARE OF A SAFETY INSTRUMENTED SYSTEM ARCHITECTURE FOR SAFETY INSTRUMENTED SYSTEMS IN A FACILITY

CROSS REFERENCE TO RELATED APPLICATIONS

The present application is a Continuation in Part of co-pending U.S. patent application Ser. No. 13/251,051 filed on Sep. 30, 2011, entitled "SYSTEM TO BUILD, ANALYZE AND MANAGE A REAL WORLD MODEL IN SOFTWARE OF A SAFETY INSTRUMENTED SYSTEM ARCHITECTURE FOR SAFETY INSTRUMENTED SYSTEMS IN A FACILITY", which claims priority to and the benefit of U.S. Provisional Patent Application Ser. No. 61/388,423 filed on Sep. 30, 2010, entitled "HEALTH METER FOR EVALUATING THE STATUS OF PROCESS SAFETY OF AT LEAST ONE FACILITY AS AN EXECUTIVE DASHBOARD ON A CLIENT DEVICE CONNECTED TO A NETWORK", and U.S. Provisional Patent Application Ser. No. 61/388,437 filed on Sep. 30, 2010, entitled "SYSTEM TO BUILD, ANALYZE AND MANAGE A REAL WORLD MODEL IN SOFTWARE OF A SAFETY INSTRUMENTED SYSTEM ARCHITECTURE FOR SAFETY INSTRUMENTED SYSTEMS IN A FACILITY". These references are incorporated herein in their entirety.

FIELD

The present embodiments generally relate to a system to generate, manage, analyze, or combinations thereof, a real world model in software of a safety instrumented system (SIS) architecture for an SIS in a facility.

BACKGROUND

A need exists for a system that can target risk reduction requirements versus achieved results from safety integrity level (SIL) calculations for a facility having a hazard and risk assessment and an associated layer of protective analysis (LOPA).

A further need exists for a system that compares test intervals assumed in safety integrity level (SIL) calculations to actual test completions being recorded.

Another need exists for a system which can compare device failure rates assumed in safety integrity level (SIL) calculations versus actual failure rates recorded.

A need exists for a system that provides a downtime estimate for repair on devices, software, or processes, or even an entire facility in safety integrity level (SIL) calculations and compares that downtime estimate to actual availability with actual time in a bypass situation.

A need exists for a system that identifies demand sources and causes named in at least a layer of protective analysis (LOPA) and compares the identified demand sources to actual demands as recorded.

A need exists for a system that identifies safety instrumented system (SIS) lifecycle phases required for projects versus phases of completed projects on a real time dashboard for multiuser viewing.

The present embodiments meet these needs.

BRIEF DESCRIPTION OF THE DRAWINGS

The detailed description will be better understood in conjunction with the accompanying drawings as follows:

FIG. 1A depicts the component library according to one or more embodiments.

FIG. 1B shows the assembly library according to one or more embodiments.

FIG. 1C shows the logic solver library according to one or more embodiments.

FIG. 1D depicts the assembly-component relationship table according to the system.

FIG. 2A is an embodiment of an assembly group library according to one or more embodiments.

FIG. 2B is an embodiment of an assembly group-assembly relationship table according to one or more embodiments.

FIG. 3A shows the instrumented protective function (IPF) library according to one or more embodiments.

FIG. 3B shows an embodiment of the instrumented protective function-assembly group relationship table according to one or more embodiments.

FIG. 3C shows a document library according to one or more embodiments.

FIG. 3D shows the library of publications used with the system.

FIGS. 7A and 7B are an example of a test plan template that has been modified to a functional test plan.

FIG. 8A shows the facility asset/maintenance management system table according to one or more embodiments.

FIG. 8B shows the assembly data used for a safety integrity level (SIL) calculations table according to one or more embodiments.

FIGS. 10A-10C are details of the data storage and computer instructions contained therein.

FIG. 11 is a representation of the libraries that can be stored in the data storage.

FIGS. 13A-13C depict the client device, which can include various additional computer instructions usable with the executive dashboard according to one or more embodiments.

Figure 4:
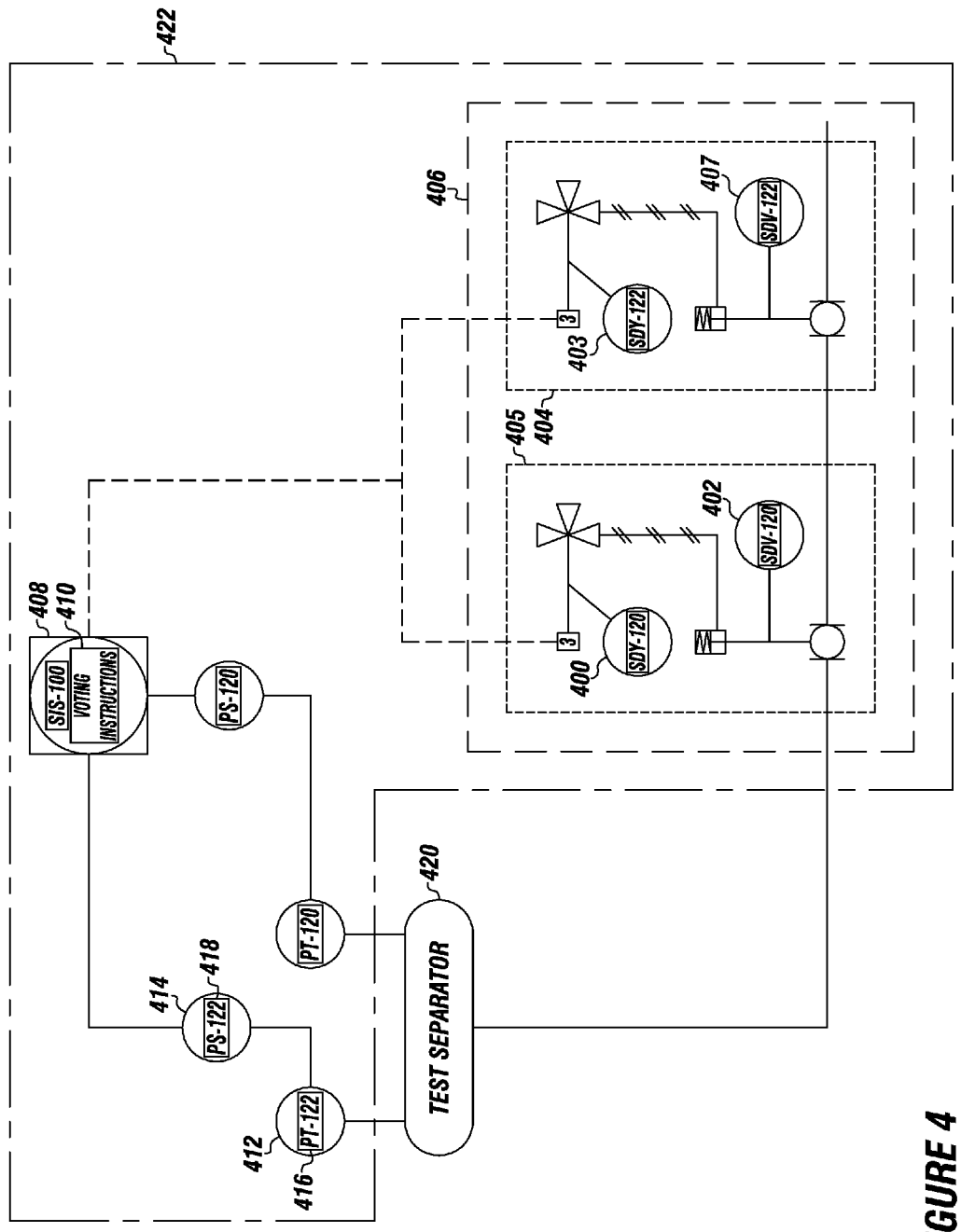
FIG. 4 shows a graphical depiction of a safety instrumented function (SIF) according to one or more embodiments.

The present embodiments are detailed below with reference to the listed Figures.

DETAILED DESCRIPTION OF THE EMBODIMENTS

Before explaining the present system in detail, it is to be understood that the system is not limited to the particular embodiments and that it can be practiced or carried out in various ways.

The embodiments relate to a system to provide a test plan to facility owners to validate at least one instrumented protective function (IPF) in a real world model.

The system helps prevent explosions in a facility by making measurements for safety device that can be used to predict the possibility of loss of containment of dangerous, volatile, and explosive and otherwise hazardous and toxic materials on a hazard by hazard basis.

The system provides a comparison of target risk reduction requirements to achieved results from safety integrity level (SIL) calculations for a facility having a hazard and risk assessment and an associated layer of protective analysis (LOPA).

The system helps prevent environmental spills by predicting when particular devices will become defective.

The system compares test intervals assumed in safety integrity level (SIL) calculations to actual test completions being recorded at a facility.

The system enables facilities to be safer for humans to work in and breathe in because the system can predict when emissions are more likely to occur or excursions that would be disastrously harmful to neighboring farms, children, and localities nearby the facility.

The system can compare device failure rates assumed in safety integrity level (SIL) calculations versus actual failure rates recorded at a facility.

The system helps prevent the loss of life or the loss of a hand or a foot because the system identifies which protective layers prevent multiple permanent injuries and which protective layers prevent multiple loss of life. The system helps save lives.

The system provides a downtime estimate for repair of devices, software, processes, or even an entire facility in safety integrity level (SIL) calculations and compares that downtime estimate to actual availability with actual time in a bypass situation.

Had this system been in place on the rig in the Gulf of Mexico which caused one of the largest disasters in United States history, the system could have significantly helped in identifying the blow out preventer defect due to its faulty maintenance schedule.

The system can have both (1) alerted rig operators in real time to faulty maintenance, and (2) provided documentation in real time, practically instantaneously, that the rig was late with its preventive maintenance which would have been very helpful to prevent proceeding under the faulty maintenance situation and thereby saving the 11 human lives lost and prevented spilling the millions of gallons of oil into the Gulf of Mexico.

The unique system identifies demand sources and causes named in at least a layer of protective analysis (LOPA), and compares the identified demand sources to actual demands as recorded regarding at least a portion of a facility.

The system identifies safety instrumented system (SIS) lifecycle phases required for projects versus phases of completed projects on a real time dashboard for multiuser viewing.

The present embodiments generally relate to a system to computer generate, manage, analyze, or combinations thereof, a software model of a safety instrumented system (SIS) architecture for safety instrument systems (SIS) in a facility, such as a low oxygen shut down interlock architecture for a burner management system in a refinery.

The SIS architecture for a SIS in a facility can include at least one instrumented protective function (IPF) such as a high stack temperature interlock.

For the purpose of this application the term "instrumented protective function" (IPF) means an instrumented protective function or other protective layer for a component, an assembly, an assembly group, or combinations thereof, such as an operator alarm, safety relief valve, or a basic process control interlock.

The term "an average probability of failure on demand" as used herein refers to an average probability for either: an assembly probability of failure on demand as calculated by a SIL calculation engine; a probability of failure on demand (PFD) for the logic solver, calculated assembly group failure on demand, calculated instrumented protective function probability of failure on demand, or combinations thereof.

The term "average probability of failure on demand" refers to the probability or likelihood that the safety function, which can be a connected series of equipment or individual components of the safety function will fail to perform intended functions at the time a hazardous event occurs.

The term "functional specification" for all of the instrumented protective functions for the facility in real time refers to the logic used by the safety instrumented system (SIS) to describe the behavior required from the SIS. The functional specifications define expected changes in output states of the components used in the SIS based on current input component status.

The term "physical specification" for all of the instrumented protective functions for the facility in real time refers to the architecture of the safety instrumented system (SIS) which includes equipment redundancy, equipment types, and installation details.

The term "facility" in this application can refer to any facility, such as a chemical plant, a refinery or another type of manufacturing facility, transport vehicles, or moveable equipment that are connected or related.

The term "real time", as the term is used herein, refers to a unit of time that can be from 1 to 30 days, for example, 7 calendar days in order to make a new evaluation or new SIL calculation as required by the system.

The term "component" and "instrument" are used interchangeably in this application.

The term "assembly" refers to one or more connected components or instruments.

The term "assembly group" refers to one or more connected assemblies.

The term "test plan" refers to one or more plans to verify that the instrumented protective functions (IPF) are performing as expected. Embodiments of the system can use multiple test plans in combination to incorporate multiple IPFs to test an entire safety instrumented system (SIS).

The term "safety integrity level" (SIL) refers to a discrete level, one out of four for specifying the safety integrity requirements of a safety instrumented function to be allocated to the safety integrated system. SIL 1 has the lowest level of safety integrity; Safety SIL 4 has the highest. See, for example, the definition used in the International Electrotechnical Commission standard known as "IEC" Number 61511-1 from 2002 provides clear definitions of an SIL.

The term "architectural constraint requirements" refers to the redundancy of equipment required to achieve a desired safety integrity level (SIL). Additional redundancy may be required to reach a higher safety integrity levels and maintain instrumented protective function (IPF) architectural constraint requirement for an SIS.

The term "facility historian", as the term is used herein can include computer software and/or hardware system(s) that are connected to a logic solver, for example, the basic process control system that provides continuous control of the facility equipment, that provide continuous collection of potentially large volumes of data and combine advanced data storage and compression techniques to capture and store time-series information in real time that help management evaluate a facility's process operating conditions and make performance decisions.

The system to computer generate a real world model in software can be in support of process safety lifecycle management.

Process safety lifecycle management can be a management process for monitoring and studying the integrity of pieces of equipment, procedures and processes, functions, and software that can be designed for use in a facility and to predict when these items need to be repaired, replaced, cleaned or upgraded or some similar activity to ensure they keep working in their optimum condition and most desirably according to their design specifications.

The system can include a processor and a data storage connected to the processor. The processor can be a laptop or server with a processor.

The data storage can be an integral data storage, a jump drive capable of holding gigabytes, or a data storage at another location, remote to the location of the processor.

The system can include computer instructions to form a component library that can be used in the facility and places this library in the data storage.

A component library for a chemical facility, for example, can include reactor heater, reactor pump, valves, sensors, relays, logic solvers, connecting to a control panel to monitor the ingress and egress and the actual transformation of the chemicals in the plant.

Additionally, the system can include computer instructions forming an assembly library for the facility in the data storage. The assembly library can have a test interval specification for each identified assembly.

For example, in a chemical plant, an assembly can be a combination of components, such as element sensors and interposing relays that read and transmit a temperature signal to a logic solver. The test interval specification for that assembly can be every 12 months.

In one or more embodiments, an illustrative system can include computer instructions forming an assembly-component relationship table in the data storage.

The assembly-component relationship table can associate individual components from the component library with assemblies from the assembly library and form a table cross paring at least one item from each library.

The component library and the assembly library can enable the assembly-component relationship table to depict a relationship between one of the assemblies and at least one component and to provide a purpose for each component in each assembly. An example of a purpose can be the function of a sensor component of an assembly.

The system can include computer instructions to generate a test plan template from a test plan template library. The generated test plan template in the library can have a collection of tasks or steps for an assembly, an assembly parameter, an assembly group, or combinations thereof. The computer instructions in the data storage that form the test plan template library with tasks and steps for testing can include tasks and steps for testing not only individual assemblies, but also testing assembly parameters, testing assembly groups, and combinations thereof; within an instrumented protective function (IPF).

The system can include computer instructions to match the generated test plan template to an assembly type using at least one of a plurality of assembly types stored in the assembly library.

The system can include computer instructions to designate preferences for assembly level testing or assembly group level testing, or combinations thereof, for each instrumented protective function (IPF) using the generated test plan template and an instrumented protective functions (IPF) library for the facility.

The IPF library can include preference selections for each IPF in the IPF library.

The system can include computer instructions to generate a test plan using the generated test plan template, the designated preferences for assembly level testing or assembly group level testing, or combinations thereof, and the assembly type, the assembly, the assembly parameter, the assembly group, or combinations thereof.

The system can include computer instructions to generate a test schedule for each designated preference using the generated test plan.

The system can include computer instructions to generate a look ahead forecast for preset periods of time for each designated preference or groups of designated preferences in the test schedule.

In an embodiment, the system can include computer instructions to create a report of the generated test plans for each instrumented protective function (IPF) with a test plan preference, the test scheduling for each instrumented protective function (IPF) with a test plan preference, a look ahead forecast for each instrumented protective function (IPF) with a test plan preference, and combinations thereof.

In an embodiment, the system can include computer instructions to generate a critical alarm list including risk ranking of hazards to which alarms applies.

In an embodiment, the system can include computer instructions to generate a report of test performance for critical alarms.

In an embodiment, the system can include computer instructions to generate a report showing impact of bypassing on a risk gap being opened by placing equipment in bypass.

In an embodiment, the system can include computer instructions to match the generated test plan template to an assembly type by selecting one generated test plan template name for each assembly type in the assembly library, wherein the matching is much likes a mail merge.

In an embodiment, the system can include computer instructions for designating preferences for assembly level testing, or assembly group level testing, or combinations thereof, for each IPF using the test plan template and the IPF library.

These computer instructions for designating preferences can perform the steps: selecting an IPF from the IPF library; selecting either an assembly preference or assembly group level preference from the IPF library; storing selected assembly preferences or assembly group level preferences in the IPF library with a preference identifier; matching individual assemblies, assembly groups or combinations thereof, from the assembly library, assembly group library or combinations thereof; as filtered by the selected IPF to each preference identifier.

In an embodiment, the system can include computer instructions to generate a test plan that include the steps of selecting an IPF from the IPF library forming a selected IPF; matching a selected IPF to preference identifiers using the IPF library; matching a preference identifier to each assembly, assembly parameter, assembly group and combinations thereof, using the assembly library; matching each assembly, assembly parameter, assembly group to an assembly type using the assembly library; matching each assembly type to a test plan template using both the assembly type library and the test plan template library; using the matched designated preferences to the test plan template to generate the test plan.

In an embodiment, the system can include computer instructions to generate a test schedule for each designated preference.

These computer instructions can generate a test schedule by performing the steps of: selecting an IPF from the IPF library using a location; selecting either an assembly preference or assembly group level preference from the IPF library; selecting a date for testing selected preferences from a calendar; selecting a recurrence interval of time for repeating the testing of the selected preference having a start date and an end date; and saving the selected preferences of date and reoccurrence interval for each selected IPF with location while generating a test schedule.

In an embodiment, the system can include computer instructions to generate a look ahead forecast for each generated test schedule, identifying a location and all IPF for the location.

The computer instructions to generate a look ahead forecast can perform the steps of identifying a location; identifying a start date and an end date creating a forecast window; and identifying all dates in the test schedule and all reoccurrence dates in the test schedule for testing each assembly, each assembly parameter, each assembly group, and combinations thereof, at the location and within the forecast window.

Turning now to the Figures, FIGS. 1A-1D depict a component library, an assembly library, a logic solver library and an assembly-component relationship table according to the system.

FIG. 1A shows the component library 316 containing the following information: a component identifier 304 for components in the assembly for identifying the component in the system; a tag name 320 for identifying the instrument in a drawing; a component type 322 describes a specific installation and operation at that specific installation; an equipment type 324.

The component library 316 further contains a name representing an instance of equipment type 335; a process description 337; an asset identifier 339 for identifying the instrument with a third party system to track the instrument location for maintenance, additional use, cost of ownership, and for use in inventory management. The asset identifier can be a serial number.

The component library 316 further contains a means for reconciling identifier 341 for component lists with third party software related to the instrument and combinations thereof.

FIG. 1B shows the assembly library 308 including the assembly identifier 302 for the assembly for use in the library; a name of the assembly 312 representing at least one component.

The assembly library 308 further includes an assembly type 314 and the assembly library includes descriptions of a specific installation and operation at that specific installation; a process description 323 of the assembly, such as separator pressure; and a location 325 of the assembly in a facility.

The assembly library 308 further includes an assembly probability of failure on demand 327 as calculated by an SIL calculation engine; an assembly based actuator to permit override 329 of the SIL calculation engine in the system and allow manual entry of a probability of failure for that assembly.

The assembly library 308 further includes the document identifier 331 that provides a link to the document library; an overt fault status 333 that can describe a state to transition an assembly to when an overt fault is recognized.

FIG. 1C shows a logic solver library 309 includes a logic solver identifier 311, such as 101 or null; a logic solver location 313; and a name of a logic solver 315.

The logic solver further includes a description of the logic solver 317; a probability of failure on demand (PFD) for the logic solver 319; and a testing interval 321 to define a required test.

FIG. 1D shows the assembly component relationship table 300 which can have an assembly identifier 302, the component identifier 304, a purpose 306, and the logic solver 307.

The assembly identifier 302 column can have a value such as "10" extracted from an assembly library 308.

The purpose 306 column can have a value such as "sensor."

The logic solver 307 column can have a logic solver identifier extracted from the logic solver library 309.

The system can include computer instructions for forming an assembly group library for the facility in the data storage.

For example, the assembly group can be two temperature sensing assemblies for a furnace. For example another assembly group can be two fuel gas block valves assembly for the same furnace.

Each assembly group can have a unique identifier and contain one or more assemblies. Each assembly group can be displayed to a user of the system as a description.

FIG. 2A shows the assembly group library 342 which includes: an assembly group identifier 344; a name 346 of each assembly group; the voting instruction 348 of each assembly group; and a user entered assumption for an assembly group 349, such as testing interval.

The assembly group library can further include a calculated assembly group failure on demand 351; the document identifier 331 associated with assembly group, and combinations thereof; and an assembly group type 360.

The system can include computer instructions to form an assembly group-assembly relationship table in the data storage.

These computer instructions can compile data from the assembly group library and the assembly library and create the assembly group-assembly relationship table depicting a relationship between at least one assembly group and at least one assembly and providing a parameter for each assembly.

FIG. 2B provides a detailed depiction of an assembly group-assembly relationship table 332.

The assembly group-assembly relationship table 332 can have columns for an assembly group identifier 344.

The assembly group-assembly relationship table 332 can include: the assembly group identifier 344; the assembly identifier 302; an assembly parameter identifier 352; an assembly parameter value 356; and a parameter unit 358.

The assembly group identifier 344 column can have a value such as "100" extracted from an assembly group library 342.

The assembly identifier 302 column can have a value such as "10" extracted from the assembly library 308.

The assembly parameter identifier 352 column can have a value such as "11" extracted from the assembly group library.

The assembly parameter value 356 column can have a value such as "150". The parameter unit 358 column can have a unit such as "PSIG."

FIG. 3A shows an embodiment of the instrumented protective function (IPF) library 372 including a protective layer identifier 374; an instrumented protective function (IPF) name 376; an input group voting instruction 378; and an output group voting instruction 380.

The instrumented protective function (IPF) library 372 can also include a calculated instrumented protective function probability of failure on demand 381; and an instrumented protective function (IPF) based actuator to permit override 383 of the IPF safety integrity level (SIL) calculation engine in the system and can allow manual entry of a probability of failure for that IPF.

The IPF library can include preference selections 385 for each IPF in the IPF library. For example, 1001_PREF_02 is an assembly preference selection.

Also, 1020_PREF_05 can be an assembly group level preference selection.

1030_Pref_006 can be an assembly parameter level preference selection.

An example of an instrumented protective function (IPF) can be a low charge flow on a furnace for a refinery.

The system can create an instrumented protective function (IPF)-assembly group relationship table which can include relationships between at least one IPF and at least one assembly group, forming a safety instrumented system (SIS) with at least one IPF, using the IPF libraries and assembly group library.

Additionally, the system can include computer instructions to compile data from the library of instrumented protective functions and assembly group library and form an instrumented protective function-assembly group relationship table in the data storage.

FIG. 3B shows an embodiment of the instrumented protection function (IPF)-assembly group relationship table 362.

The IPF-assembly group relationship table 362 includes: an IPF identifier 374; the assembly group identifier 344; an IPF to assembly group relationship identifier 375; and an indication 386 that an assembly group can be functioning as additional action, not included in the IPF SIL calculation engine.

The system can include a document library.

FIG. 3C shows an embodiment of a document library.

A document library 299 includes: a document identifier 331 that provide a link to the document library from another table created by the system.

The library can include an indication of document types 353, as well as document names 355 and document descriptions 357.

Some of the document types can be cause and effect diagram document; safety requirements specification document; layer of protective analysis document types; test plan procedures; SIL calculation modeling files; override risk assessment; and safety integrity level calculation, or combinations thereof.

FIG. 3D shows the library of publications 301 used with the system.

The data storage can include a library of publications 301 viewable for compliance including: statutes (US CODE) 290; industry standards (IEC codes) 291; national regulation (CFR 1910.119) 292; and business owner specific policies 293 and combinations thereof.

The instrumented protective functions (IPF) library 372, the library of publications 301, the library of documents 299 and the assembly group library 342 enable the IPF-assembly group relationship table 374 to depict the relationship between at least one IPF and at least one assembly group, forming a safety instrumented system (SIS) which can have at least one instrumented protective function (IPF).

In one or more embodiments, the system can include computer instructions that determine functional relationships between assembly groups and assemblies, and create a tag based software model which can have tags and voting instructions, to be used between assembly groups and assemblies.

FIG. 4 shows a graphical depiction of an SIF-422.

A first assembly 405 can include a first component SDY-120 400 and second component SDV-120 402.

The first assembly 405 can be a part of an assembly group 406 with other assemblies such as a second assembly 404 which can have a second instance of a first component 403 and a second instance of the second component 407.

The SIF-422 can also have a logic solver SIS-100 408.

The logic solver SIS-100 408 can contain voting instructions 410 which can be the logic used to process signals.

The SIF-422 can also have additional components. A first instance of a second component can be identified as element 412 with a tag PT-122 identified as element 416.

A second instance of a second component can be identified as element 414 with a tag PT-122 identified as element 418.

The computer generated safety instrumented system can also have a test separator 420.

These computer instructions can create a tag based software model that represents the functional specifications for each of the identified instrumented protective functions (IPF) for the facility, for the identified piece of equipment, process or software, or combinations thereof, in real time.

In one or more embodiments, the combinations of libraries and relationship tables can define the physical specifications which can be needed to operate a facility safely with a safety instrumented system.

The term "physical specifications" as the term is used herein refers to the actual hardware, software, process or procedure of the facility and how these elements are actually connected together or used in sequence.

The combination of computer instructions, when actuated, can execute safety integrity level (SIL) calculations based on the physical specifications, voting instructions, and test interval specifications, and determine an average probability of failure on demand for each instrumented protective function (IPF).

As an example, an average probability of failure on demand of an IPF can be $1.57 \times 10^{-2}$ in scientific notation.

The system can further include computer instructions that permit a user to change any one component, one assembly, one assembly group, or combinations thereof or the voting instructions of the tag based software model.

In one or more embodiments, the system can further include computer instructions that provide a connection to tag based assets of the facility that can allow transfer of data from tag based asset to the data storage associated with the processor.

The software model can further include a logic solver as a component of the instrumented protective functions (IPF) to execute the voting instructions that carry out the functions of the instrumented protective functions (IPF).

The logic solver provides a voting relationship, essentially a functional relationship, between the assemblies and assembly groups.

The system can also include computer instructions to use the relationship tables and the libraries to form a cause and effect report.

Figure 5:
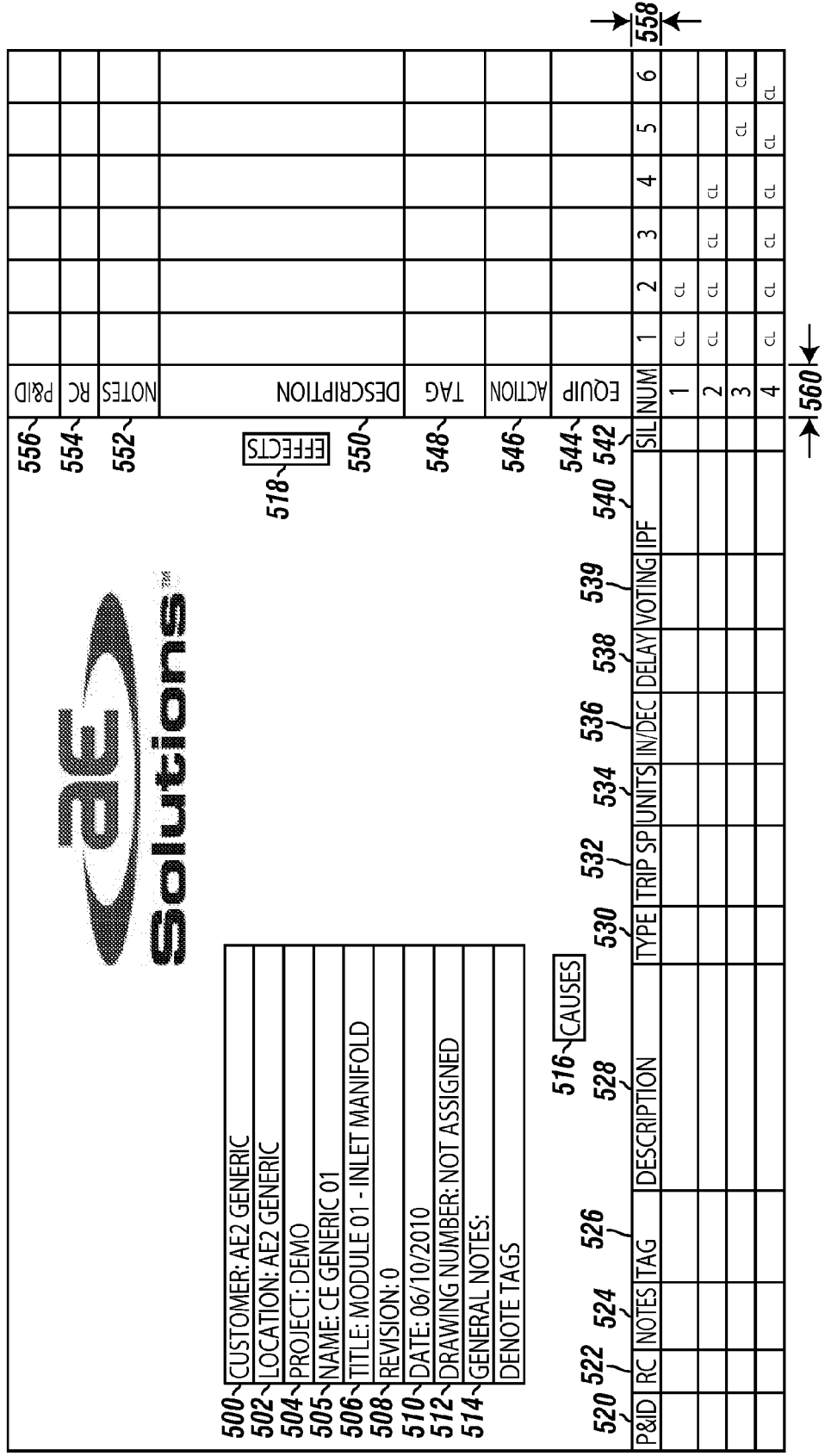
FIG. 5 shows an embodiment of a cause and effect report according to one or more embodiments.

FIG. 5 shows an embodiment of a cause and effect report.

The cause and effect report can have general information such as customer 500, location 502, project 504, name 505, title 506, revision 508, date 510, drawing number 512, and general notes 514.

The cause and effect report can also have a table of causes 516 aligned to intersect a table of effects 518.

The table of causes 516 can have columns for causes P&ID 520, causes RC 522, causes notes 524, causes tag 526, causes description 528, causes type 530, causes trip SP 532, causes units 534, causes in/dec 536, causes delay 538, causes voting 539, causes IF 540, and causes SIL 542.

The table of effects 518 can have columns for effects equip 544, effects action 546, effects tag 548, effects description 550, effects notes 552, effects RC 554, and effects P&ID 556.

The intersection of the causes table 516 and effects table 518 can have a column titled "Num" 560 and a row titled "Num" 558. The intersections can show causes and any corresponding effects.

In an embodiment of the system, computer instructions can be used to create a library of test plan templates.

Additional computer instructions in the data storage can instruct the processor to generate additional functional test plans for any one of the assemblies, one or more of the assembly groups, parameters of assemblies, an instrumented protective function (IPF) or designated group of IPFs, and combinations thereof.

The functional test plans can be formulated from one of a plurality of test plan templates that can be preloaded and stored in the data storage in the library of test plan templates.

The test plan templates can be user editable as a feature of this system. This means the user can modify quickly without the need for hiring an outside contractor at great expense and delay to get the information they need fast.

Figure 6:
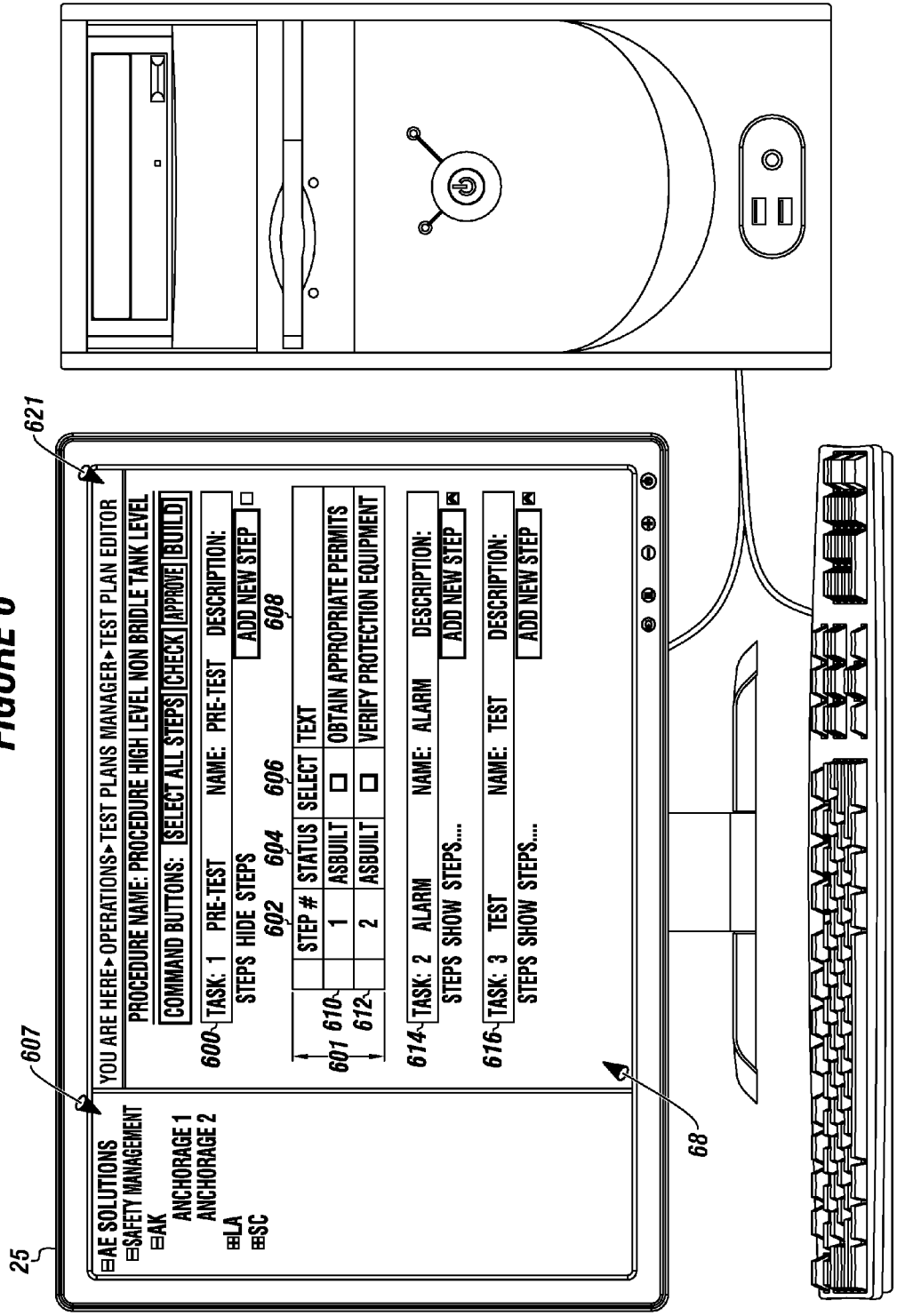
FIG. 6 is a view of a test plan template with a location tree according to one or more embodiments.

FIG. 6 is an example of a test plan template 68.

The system can use computer instructions to provide a location tree 607 on a test plan template for each component in the model, each IPF, each assembly, each assembly group and combinations thereof.

The system can include computer instructions in data storage to provide a page identifier 621 shown on the test plan template 68.

The page identifier can be used throughout the SIS model to display which module of the SIS model that a user can be within at any time providing a hierarchy of modules associated with the user location.

The test plan template can include one or more tasks, such as first task 600, second task 614, and third task 616, in support of process safety lifecycle management. Each task can include at least one instructional step, depicted here as first instructional step 610 and second instructional step 612, for test plan execution.

A test plan template can include the first task 600, which can have a table of steps 601 with columns for: step number 602, status 604, select 606, and text 608.

A step number one 610 can have the value of the step number 602 column set at a value such as "1", the Status 604 column set at a value such as "asbuilt", and the Select 606 column can be a check box for selection of the step.

The text 608 column can be set to a value such as it appears in FIG. 6, for the step number one 610, "Obtain appropriate permits".

The test plan template 68 can be presented on a display 25 connected to a client device 10.

FIGS. 7A and 7B are an example of a test plan template that has been modified to a functional test plan.

An example functional test plan for an assembly, as shown in FIG. 7A and continued on 7B, can have tables, areas, spaces, or slots for general information about the test plan, such as facility 720 to identify the associated facility and assembly name 721 to identify the associated assembly.

The functional test plan can also include a test plan name 724 to identify the test plan.

The functional test plan can also include tables, areas, spaces, or slots for process description 726, test plan status and approval information 728, work requirements 730 such as required permits 731, drawings and documents for reference 732, assembly parameters/threshold limits 734, and comments about the assembly 736.

The functional test plan can also include an area to record test results 738.

The functional test plan can also include, as shown on 7B, an area for sign-off and approval 740.

The functional test plan can include a table of detail information and steps to execute 750. The table can have columns for task 700, step 702, staff 704, check mark 714, and work method steps 708.

A task such as task "1" 710 can have multiple steps such as step "1" 712 and step "2" 718. The step "1" 712 can have an associated checkbox 714 to indicate completion of the step and an associated work method step 716 which can describe the step in detail, such as "Obtain the appropriate permits for the testing and provide the proper notifications to operating personnel regarding the testing, any special requirements, and subsequent alarms that can be generated."

The functional test plan can also include an area for Tester Comments—Additional Steps 742 and Observed Deficiencies and Corrective Actions 744.

Computer instructions in the data storage of the system can instruct the processor to select a test plan template based on voting instructions from one of the tagged assets of the software model and use physical specifications of an assembly, an assembly group, an IPF, or combinations thereof which can have been identified in the data storage or in the software model.

In one or more embodiments, the test plan template can include a plurality of tasks in support of process safety lifecycle management. An example of a task can be opening a neck valve for a test plan template.

Each task can include at least one instructional step for functional test plan execution, or it can have a group of steps to achieve functional test plan execution.

The system can include computer instructions to use the relationship tables to match components to either components used in a facility asset management system, components used in a facility maintenance management system, or combinations of these components in both facility asset management systems and facility maintenance management systems.

A "facility asset management system", as the term is used herein, includes computer software and/or hardware system(s) that aid in the process of managing tasks and decisions surrounding the purchase, ingestion, annotation, cataloguing, storage, retrieval, maintenance and distribution of physical assets in a facility, for example, tracking the life cycle of a temperature sensor in a refinery.

A "facility maintenance management system", as the term is used herein means includes computer software and/or hardware system(s) that aid in managing an organizations maintenance operations in order to help maintenance workers do their jobs more effectively, for example, determining which equipment require maintenance and which storerooms contain the spare parts they need, and to help management make informed decisions, for example, calculating the cost of equipment breakdown repair versus preventive maintenance for the equipment, possibly leading to better allocation of resources.

In one or more embodiments, the matching of components matches failure rates in safety integrated level (SIL) calculations.

For example, the matching of components to SIL calculations can occur by first matching tag names in data storage to tag names in a facility asset management system. Then, that match can allow the failure rate in the data storage to be compared to failure rates being recorded by the facility asset management system.

An example an asset with a tag name PS-120 in the data storage matched to the tag name PS-120 in the facility asset management system. The failure rate for PS-120 in data storage can be 1 in 38,000 hours, and the failure rate for PS-120 in the facility asset management system can be 1 in 24,000 hours.

In one or more embodiments, the matching of components also matches test intervals in SIL calculations compared to actual test intervals in the facility maintenance management system.

An example an asset with a tag name PS-120 in the data storage matched to the tag name PS-120 in the facility maintenance management system. The test interval for PS-120 in data storage can be once every 12 months, and the test interval for PS-120 in the facility maintenance management system can be 1 time every 16 months.

In one or more embodiments, the matching of components compares trip points of parameters for each assembly to trip points recorded in one of the facility asset or maintenance management systems.

An example an asset with a tag name PS-120 in the data storage matched to the tag name PS-120 in the facility asset management system. The trip point for PS-120 in data storage can be 150 psig, and the trip point for PS-120 in the facility asset management system can be 170 psig.

FIGS. 8A and 8B show a representative table produced by the system for users and viewers of the system that matches components of the facility to failure rates in SIL calculations and to those recorded by the facility asset management system, and the facility maintenance management system, as well as trip point parameters for assemblies to recorded trip points, and matches test intervals in SIL calculations to actual test intervals.

FIG. 8A shows the facility asset/maintenance management system table 800 can contain data to calculate a Second failure rate 850

The facility asset/maintenance management system table 800 can have the columns: tag name 802, field trip point 804, field trip units 806, test date 808, test result 810, and interval (since last test) 812.

A row in the table can contain values for the tag name 802 such as 'PS-120', values for the field trip point 804 such as '140', values for the field trip units 806 such as "PSIG", values for the interval (since last test) 812 such as '0'.

The table can also contain values for the test date 808, such as '1/12/2007' and test result 810 such as "pass" or "fail". These test results and dates can be used to determine a second failure rate 850.

The data from the Facility Asset/Maintenance Management System table 800 can be compared to data from an Assembly Data Used for SIL calculations table 826, shown as FIG. 8B.

FIG. 8B shows the assembly data used for SIL calculations table 826 can include columns for: assembly identifier 828, tag name 830, parameter identifier 832, trip point 834, trip units 836, test interval (months) 838, and a first failure rate 840.

The tag name 830 of the assembly data used for SIL calculations table 826 can have a value such as 'PS-120' and the first failure rate 840 value such as "$1/32,000$ hr" to compare with the Second failure rate 850 calculated using the facility Asset/Maintenance Management System table 800.

The facility asset/maintenance management system table can represent data from a facility asset management system, a facility asset maintenance management system, and combinations thereof.

Reports can be generated from the compared data, to show continuing problems with lack of inventoried parts, lack of operator training, or lack of adequate contractors to install difficult parts that become defective.

Additionally, the system can use computer instructions to update all instances of at least one component, assembly, assembly group, IPF or combinations thereof, simultaneously.

The term "instances" as used herein includes each occurrence in the data storage where a tagged asset is referenced.

Figure 9:
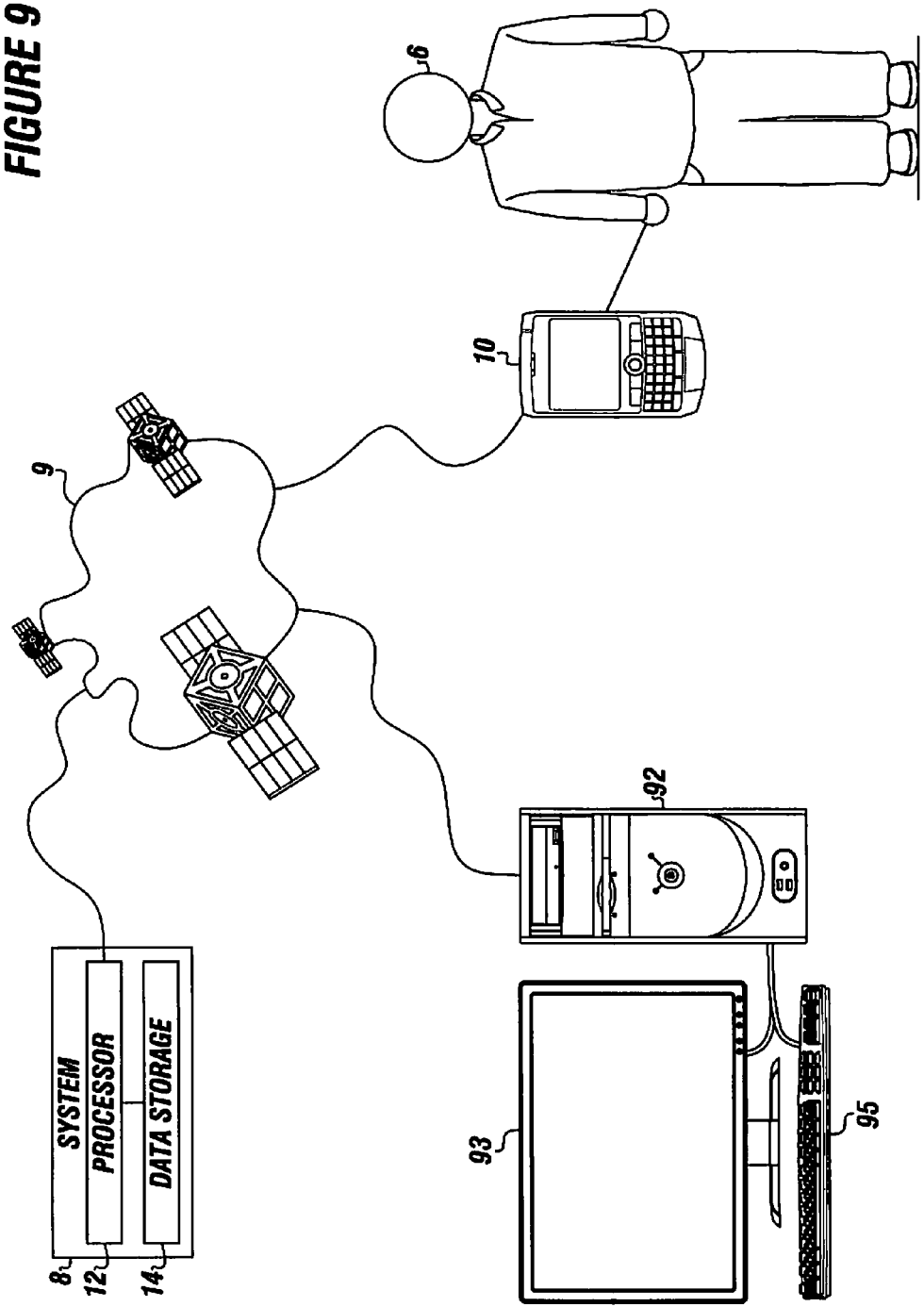
FIG. 9 depicts an overview of the system to computer generate a real world model in software of a safety instrumented system (SIS) architecture for SIS in a facility showing the different computer instructions coupled to a facility management system using a network.

FIG. 9 depicts an overview of the system to computer generate a real world model in software of a safety instrumented system (SIS) architecture for SIS in a facility showing the different computer instructions.

It should be noted for this system that the instrumented protective functions (IPFs) can be safety instrumented functions, environmental instrumented functions, commercial instrumented functions, any other safety function that protects against harm to the environment, commercial assets, or people, or combinations thereof.

The system 8 can include a processor 12 connected to a data storage 14. The processor can be in communication with a network 9. At least one client device 10 can be in communication with the network 9. Each client device can have a display for showing the status of compliance. Each client device can be manipulated by a user 6.

In one or more embodiments, a facility processor 92 with facility data storage can be in communication with the network 9. The processor can be associated or in communication a facility asset input device 95 and a facility asset display 93.

Figure 10C:
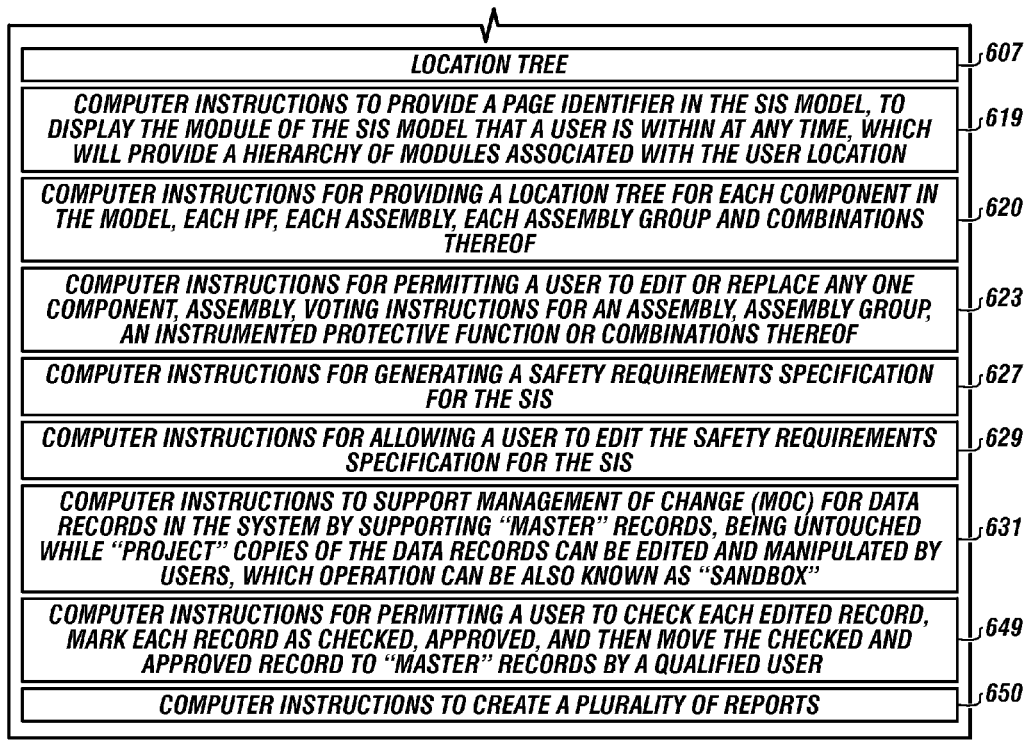

FIGS. 10A, 10B, and 10C are details of the data storage 14 and computer instructions contained therein.

The data storage 14 can include computer instructions for forming a component library 16.

The data storage 14 can include computer instructions for forming an assembly library 18.

Additionally, the data storage 14 can include computer instructions match the generated test plan template to an assembly type by selecting one generated test plan template name for each assembly type in the assembly library 20.

For example, the match of the test plan template to an assembly type would happen by selecting a test plan template name such as ball valve, for a specific assembly type such as globe ball valve. Additional ball valve assembly types can use the same test plan template for ball valves.

The data storage 14 can include computer instructions for forming an assembly-component relationship table 22.

The data storage 14 can include computer instructions for forming an assembly group library 26.

The data storage 14 can include computer instructions for forming an assembly group-assembly relationship table 30.

The data storage 14 can include computer instructions for forming a library of instrumented protective functions (IPF) 32.

The data storage 14 can include computer instructions for forming an instrumented protective function (IPF)-assembly group relationship table 34.

The data storage 14 can include computer instructions for analyzing functional relationships between assembly groups and assemblies 35.

The data storage 14 can include computer instructions for creating a tag based model with tags and voting instructions 36.

The data storage 14 can include computer instructions for adding a functional specification of the instrumented protective function (IPF) for the facility in real time, wherein real time can be a unit of time that can be less than 14 calendar days 42.

Voting instructions can refer to a plurality of logical "and" gates and "or" gates used to translate input signals received by the processor into output signals that actuate one or more of protective layers.

The data storage 14 can include computer instructions for executing SIL calculations that use physical specifications, voting instructions, and test interval specifications to determine an average probability of failure on demand for each instrumented protective function (IPF) 46.

The data storage 14 can include functional specification 49 for each component.

The data storage 14 can include physical specifications 50 for each component.

The data storage 14 can include computer instructions that permit a user to change any one component or the voting instructions 56.

The data storage 14 can include computer instructions that provide a connection to tag based assets of the facility 58.

The system can include a logic solver 60, which can be stored in the data storage 14.

The logic solver 60 can analyze interrelationships between protective layers, assembly groups, and assemblies and be a standalone processor or a virtual machine within the system.

The data storage 14 can include computer instructions for forming a cause and effect report using the relationship tables 62.

In one or more embodiments, the data storage 14 can include test plan templates 68.

The data storage 14 can include computer instructions for instructing the processor to select a test plan template based on voting instructions, and use physical specifications to create the functional test plan for an assembly, an assembly group, an IPF, or combinations thereof 74.

The data storage 14 can include computer instructions to use the relationship tables to match components to components used in a facility asset management system, components used in a facility maintenance management system, and combinations thereof 76.

The facility asset management system and facility maintenance management system can be part of the system, or a separate system transferring data into the system through a network, a manual import, or the like.

The data storage 14 can contain computer instructions for using the relationship tables to update from the facility historian of a facility 91.

The facility historian can be a part of the overall system, or exist outside the system and transfer data into the system through a network, a manual import, or the like. The facility historian can be a database in data storage of a server that connects to a facility to monitor, in real time, process controllers and operations of the facility.

The data storage 14 can include computer instructions to update all the component information in the variously libraries simultaneously 94.

The data storage 14 can include the document library 299, the library of publications 301, the component library 316, the assembly library 308, the logic solver library 309, the assembly group library 342, the instrumented protective function (IPF) library 372, the assembly-component relationship table 300.

The data storage 14 can include the assembly group-assembly relationship table 332, the IPF-assembly group relationship table 362, the safety integrity level (SIL) calculations engine 379, and the user entered assumptions for each IPF 382.

The data storage 14 can include the user specified safety integrity levels 384.

The data storage 14 can include the test plan template library with tasks having at least one step for testing individual assemblies, testing assembly parameters, testing assembly groups and combinations thereof within an instrumented protective function.

The data storage can include computer instructions to generate a test plan template from the test plan template library wherein the generated test plan template comprises a collection of tasks and steps for an assembly, an assembly parameter, an assembly group, or combinations thereof 387.

For example, the computer instructions 387 can pick a test plan template, such as a pressure switch high, from the test plan template library. The selected test plan template has tasks and steps for testing the pressure switch, such as task like test high trip, and a step for the task such as isolate switch from process, connect hand pump, pump up pressure of switch to trip point. Another task can be to verify trip occurred.

The data storage 14 can include computer instructions to match the generated test plan template to an assembly type using at least one of a plurality of assembly types stored in the assembly library 388.

For example, the computer instructions match the pressure switch templates to an assembly type, such as pressure switch in the assembly library 308.

The data storage 14 can include computer instructions to designate preferences for assembly level testing or assembly group level testing, or combinations thereof, for each instrumented protective function (IPF) using the generated test plan template and the instrumented protective functions (IPF)s library for the facility 389.

For example, the computer instructions 389 can designate preference for an IPF ID 1010 and the preference can be named 1010_PREF_04 for assembly group level testing.

As another example, the computer instructions 389 for designating preferences for assembly level testing, assembly group level testing, and combinations thereof, for each IPF using the test plan template and the IPF library perform the steps: (a) selecting an IPF from the IPF library; (b) selecting either an assembly preference or an assembly group level preference from the IPF library; (c) storing the selected assembly preference or assembly group level preference in the IPF library with a preference identifier; and (d) matching individual assemblies, assembly groups, and combinations thereof, from the assembly library, assembly group library or combinations thereof; as filtered by the selected IPF to each preference identifier.

As an example, an IPF from the IPF library can be 1020. The assembly group level preference can be 1020_PREF_05. The selected assembly is stored to the IPF library with the preference identifier. Then individual assemblies from the assembly library such as TT-130 for a temperature transmitter are matched to the preference identifier as filtered by the selected IPF.

The data storage 14 can include computer instructions to generate a test plan using the generated test plan template, the designated preferences for assembly level testing or assembly group level testing, or combinations thereof, and the assembly type, the assembly, the assembly parameter, the assembly group, or combinations thereof 390.

For example, the computer instructions 390 can generate an assembly group level test plan when IPF ID 1010 is selected using the preference name 1010_PREF_04, and the test plan template called "pressure switch high."

In an embodiment, the computer instructions 390 to generate a test plan can perform the steps: selecting an IPF from the IPF library forming a selected IPF; matching a selected IPF to preference identifiers using the IPF library; matching a preference identifier to each assembly, assembly parameter, assembly group, and combinations thereof, using the assembly library; matching each assembly, assembly parameter, assembly group and combinations thereof, to an assembly type using the assembly library; matching each assembly type to a test plan template using both the assembly type library and the test plan template library; and matching designated preferences to the test plan template to generate the test plan.

These computer instructions can first select an IPF such as 1030 from the IPF library and then match 1030 to a preference identifier, such as 1030_PREF_06. Then the preference identifier is matched to an assembly parameter, such as a heater with a loss of flame called BE-130 LO. The assembly parameter is matched to an assembly type using the assembly library. In this case the assembly type can be a flame scanner. The flame scanner is then matched to a test plan template, such as flame scanner loss of plane from the test plan template library. The designated preferences are then matched to the test plan template to generate a test plan for the heater IPF 1030.

The data storage 14 can include computer instructions 391 to generate a test schedule for each designated preference using the generated test plan.

For example the computer instructions 391 can generate a test schedule for the preference 1010_PREF_004 by selecting a date, such as Mar. 4, 2012, and a recurrence date of annually (every 12 months) to produce a plurality of test dates over time.

The computer instructions to generate a test schedule 391 for each designated preference can perform the steps of: selecting an IPF from the IPF library using a location; selecting either an assembly preference or assembly group level preference from the IPF library; selecting a date for testing a selected preference; selecting a recurrence interval for repeating the testing of selected preferences; and saving preferences for each selected IPF with location and generating a test schedule.

For example, an IPF such as 1000 can be selected from the IPF library using a location 10 shown as element 325 in FIG. 1B. Then an assembly preference is selected from the IPF library, such as 1000_PREF_02. Then a date for testing a selected preference is selected, such as Apr. 5, 2014. Next, a reoccurrence interval is picked for repeating the testing of the selected preference, such as 18 months. The preferences for each selected EPF with location are saved and a test schedule is generated that depicts the dates, intervals, and preferences for the IPF testing.

The data storage can include computer instructions to generate a look ahead forecast for preset periods of time for each designated preference or groups of designated preferences in the test schedule 392.

For example, for a preset period of time, such as Mar. 2, 2015 to Mar. 2, 2016, all the dates for testing can be listed within that window by setting a start date and an end date. Each look ahead forecast can have not only all the test dates, but also all the preferences associated with each test date.

The computer instructions 392 to generate a look ahead forecast for the test schedule with an identified location and all IPF for the location can perform the steps: identifying a location; identifying a start date and an end date and creating a forecast window; and identifying all dates in the test schedule and all reoccurrence dates in the test schedule for testing each assembly, each assembly parameter, each assembly group, and combinations thereof, at the location and within the forecast window.

For example, first identifying a location, such as location 10 which is element 325 in FIG. 1B. Next, a start date, such as May 5, 2013 can be identified in the computer instructions. An end date, such as Jun. 7, 2013 can be identified. The time interval between the start date and the end date is a forecast window. The computer instructions can then identify all test dates including all reoccurrence dates from the test schedule, for testing each assembly, each assembly parameter, and each assembly group at the location that has a date within the forecast window. A reoccurrence date can be May 30, 2013.

The data storage 14 can include the location tree 607.

The data storage 14 can include computer instructions to provide a page identifier in the SIS model, to display the module of the SIS model that a user is within at any time, which will provide a hierarchy of modules associated with the user location 619.

The data storage 14 can include the computer instructions for providing the location tree for each component in the model, each IPF, each assembly, each assembly group and combinations thereof 620.

The data storage 14 can include computer instructions for permitting a user to edit or replace any one component, assembly, voting instructions for an assembly, assembly group, an instrumented protective function or combinations thereof 623.

The data storage 14 can include computer instructions for generating a safety requirements specification for the SIS 627.

The data storage 14 can include computer instructions for allowing a user to edit the safety requirements specification for the SIS 629.

The data storage 14 can include computer instructions to support management of change (MOC) for data records in the system by supporting "master" records, being untouched while "project" copies of the data records can be edited and manipulated by users, which operation can be also known as "sandbox" 631.

The data storage 14 can include computer instructions for permitting a user to check each edited record, mark each record as checked, approved, and then move the checked and approved record to "master" records by a qualified user 649.

The data storage includes computer instructions to create a plurality of reports 650.

The reports can include test plans for each instrumented protective function (IPF); test scheduling for each instrumented protective function (IPF); a look ahead forecast for each instrumented protective function (IPF); and combinations thereof.

For example, a report of test plans for each IPF can be a customized report with user preferences.

For example, a report of test scheduling for each IPF can be a standardized report.

As another example, the look ahead forecast can be a report that is printed or electronic.

The report, in addition to the technical information, can contain customer identification, tag name of components shown in the report, facility identification which can include the address, email contact information and phone numbers, as well as the date the report was generated.

FIG. 11 is a representation of the libraries that can be stored in the data storage 14.

The component library 316 can contain a plurality of components 17*a*, 17*b*, and 17*c*. For example, the component library can include information on a sensor, transmitter, control device, pump, motor, or solenoids.

The assembly library 308 can contain a plurality of assemblies 19a, 19b, and 19c. Each assembly 19a, 19b, and 19c can have a test interval specification 21a, 21b, and 21c, for example a test interval of 30 days. Assemblies represent groups of components connecting a processor to a process of the facility.

The assembly group library 342 can contain a plurality of assembly groups 13a, 13b, and 13c, such as pairs of sensors.

The library of instrumented protective functions (IPF) 372 can contain a plurality of IPFs, 38a, 38b, and 38c.

The logic solver library 309 can contain a plurality of logic solvers 307a, 307b, and 307c.

The document library 299 can contain a plurality of documents 298a, 298b, and 298c.

The data storage 14 can include a test plan template library 1100, which can include one or more test plan templates, such as test plan template 68, which can include tasks 1102 having at least one step for testing individual assemblies, testing assembly parameters, testing assembly groups, and combinations thereof; within an instrumented protective function (IPF) 1104 formed by computer instructions in the data storage.

The test plan library can have a plurality of test plan templates, such as test plan templates for pressure transmitter low template, temperature transmitter high level transmitter bridal installation, and level transmitter non-bridal installation.

The library of publications can be also in the data storage and is more fully described in FIG. 3D.

Figure 12:
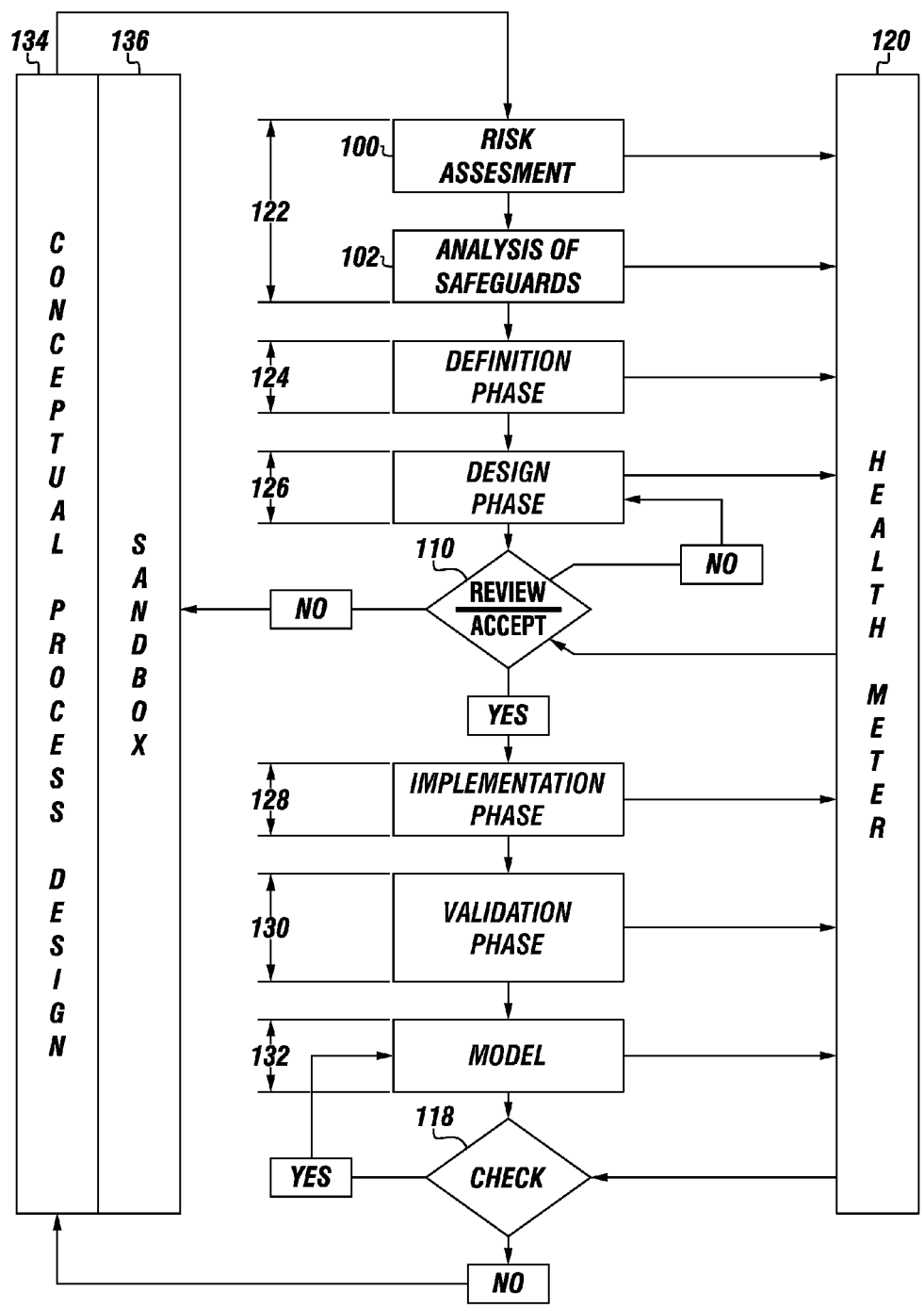
FIG. 12 is the representative sequence of steps used with the system for compliance with an OSHA regulation.

FIG. 12 shows an embodiment of an overall sequence of steps implemented by the system.

The system acquires a risk assessment 100 for a portion of a specific facility such as refinery.

The system acquires an analysis of safeguards 102 (a LOPA) for the specific facility wherein the LOPA indicates risk, such as portions of the facility that might be prone to loss of human life. The analysis of safeguards and the LOPA make up an assess phase 122.

A definition phase 124 follows the assess phase 122 and it involves editing and verifying safety requirement specifications for the safety instrumented system (SIS) with a user interface.

The next phase used by the system can be a design phase 126 that involves using the system to enter and verify a SIS design 110 and optimization using an IPF model with SIL engine for the specific process or portion of the facility.

Reviews and accept or review and decline acceptance of the SIS design 110 the designs for compliance with a statute, a regulation, or a business criteria, such as an OSHA regulation.

Next the system creates an implementation phase 128, which can include installing an assembly, IPF, or component. Next the system creates a commission and validation phase 130 which commissions the component, assembly, assembly group, or IPF, and then validates the assembly, assembly group, IPF, using a test plan created by the system.

The next step involves operating and maintaining all or a portion of the facility by running the assembly, assembly group, IPF, or component and re-testing the component, assembly, assembly group and/or IPF on a required test interval as documented in a model 132.

The system implements a check 118 which involves checking if the test results from the prior step are acceptable. If they are not, then the user must restart the process from the beginning.

The entire stage from risk assessment 100 to check 118 involves using a conceptual process design 134 in the previously identified data storage which can be accessed through a sandbox 136 in an embodiment.

The sandbox can allow a user to make a series of changes that can be used in the final implementation in order to evaluate potential changes to the component, assembly, assembly group, and impact on achieved SIL.

Additionally a health meter 120 can monitor the entire sequence of steps, wherein the health meter provides verification and integration and a checking of reality versus plan codes, standards and recognized good engineering practices in real time constantly during the entire process.

For this unique system, the computer instructions, when actuated, can execute safety integrity level (SIL) calculations for each asset of the facility can have a tag with voting instructions based on the functional specification, the physical specification, and user entered assumptions to determine an average probability of failure on demand and architectural restraint requirements for each instrumented protective function (IPF) and validate the assumptions used in the SIL calculations by comparing to actual performance of each IPF in the facility.

An embodiment of the system can include computer instructions to categorize failures (failure rate analysis) and provide statistically analyzed failure rates to be used in SIL calculations.

An embodiment can include computer instructions to allow users to select which set of reliability data they want to use, the data stored in the reliability library in the data storage, the data collected from their facility and analyzed in by the failure rate analysis portion of the system, or user entered data.

An embodiment can include computer instructions and system architecture to support management of change (MOC) of data records in the system.

The system can support "asbuilt" or "master" records, being untouched while "project" copies of the records can be edited and manipulated by users, also known as "sandbox." Each edited record can be checked, approved, and then moved to "asbuilt" by qualified users.

The term "qualified users" can mean users with sufficient permissions and roles tied to their login indicating they are able to perform the check and approve activities. Previous "asbuilt" versions of the records can be archived to maintain revision history.

An embodiment can include computer instructions to allow users to enter data and perform analysis to support PHA and LOPA.

An embodiment can include computer instructions to support analysis of protective layers to be applied to reduce probability of a hazardous event occurring.

An embodiment can include computer instructions to include analysis to calculate SIL required to reduce the risk to target level.

An embodiment can include computer instructions to connect the data of the PHA and LOPA to the SIL calculation portion of the application.

An embodiment can include computer instructions to allow users to enter tolerable risk criteria for their organization.

An embodiment can include computer instructions to support revision tracking and impact reporting on proposed changes.

An embodiment can include computer instructions to allow users to enter proposed changes and view impact reports prior to approving the change.

An embodiment can include computer instructions to allow users to enter initiating causes captured in the facility which required the SIS or other protective layers to respond.

An embodiment can include computer instructions to allow users to manage imports of PHA and LOPA import from other tools.

An embodiment can include computer instructions to analyze SIL calculations and automatically identify optimum proof test intervals that can still meet SIL.

An embodiment can include computer instructions to allow a user to enter relief valve sizing basis during design phase of a project.

An embodiment can include computer instructions to allow users to search for a relief valve sizing basis by tag name to support PHA/LOPA activities.

An embodiment can include computer instructions to create a report showing relief valve sizing basis for all relief valves used for risk reduction in a PHA/LOPA for a facility.

Figure 13B:
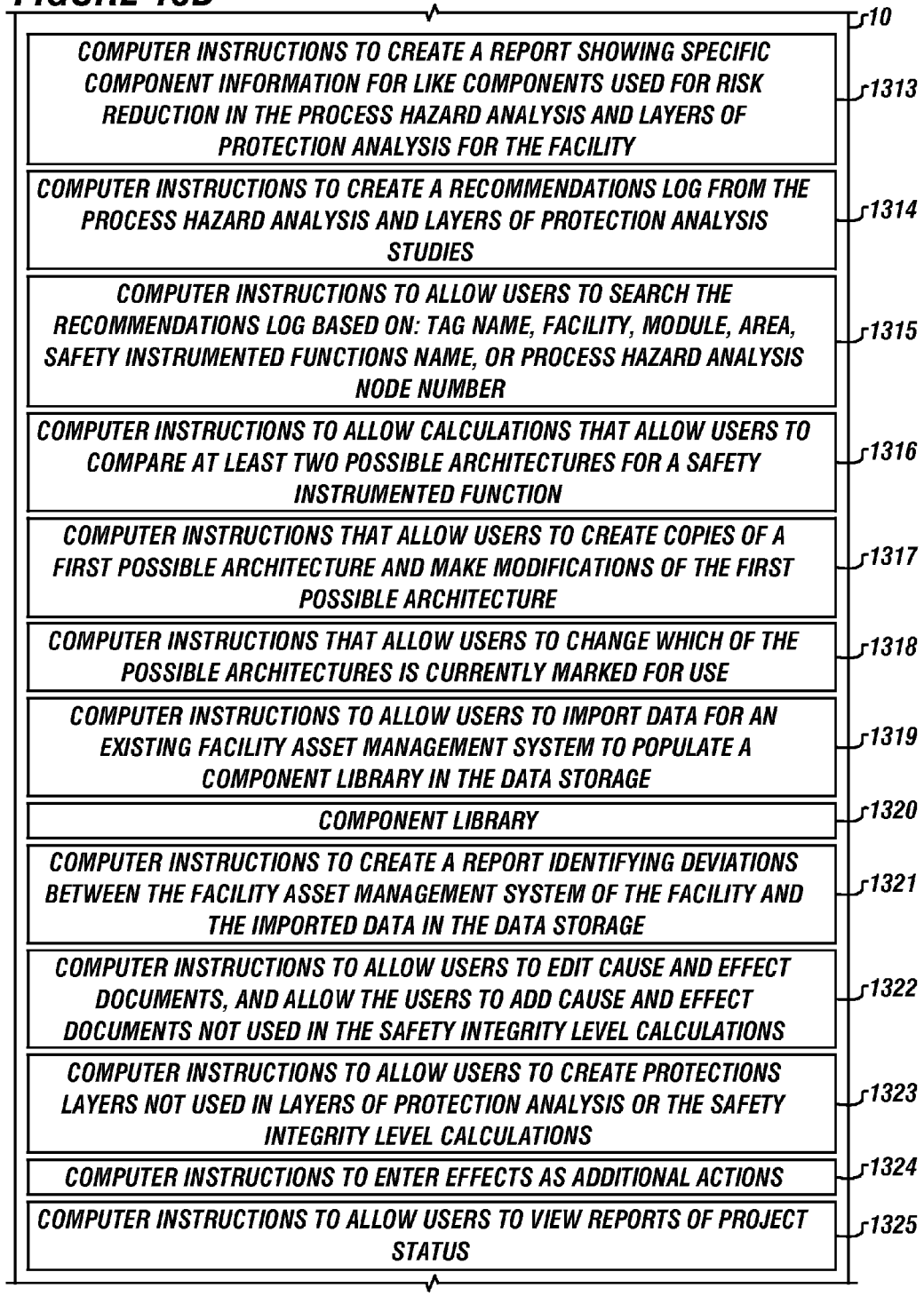

FIGS. 13A-13C depict an embodiment of the client device 10, which can include various additional computer instructions usable with the executive dashboard.

The client device 10 can include computer instructions to allow users to enter data and perform analysis to support process hazard analysis and layers of protection analysis 1300.

The client device 10 can include computer instructions to support analysis of protection layers to be applied to reduce probability of a hazardous event occurring 1302.

The client device 10 can include computer instructions to include analysis to calculate the safety integrity level calculations required to reduce risk to a target level 1303.

The client device 10 can include computer instructions to connect data of the process hazard analysis and layers of protection analysis to the safety integrity level calculations 1304.

The client device 10 can include computer instructions to allow users to enter tolerable risk criteria for the facility 1305.

The client device 10 can include computer instructions to support revision tracking and impact reporting on proposed changes 1306.

The client device 10 can include computer instructions to allow users to enter proposed changes and view impact reports prior to approving changes 1307.

The client device 10 can include computer instructions to allow users to enter initiating causes captured in the facility that require the safety instrumented systems or other protection layers to respond 1308.

The client device 10 can include computer instructions to allow users to manage imports of process hazard analysis and layers of protection analysis from other tools 1309.

The client device 10 can include computer instructions to analyze the safety integrity level calculations and automatically identify optimum proof test intervals to meet the safety integrity level calculations 1310.

The client device 10 can include computer instructions to allow users to enter a specific component for use in an instrumented protective function during design phase of a project 1311.

The client device 10 can include computer instructions to allow users to search for the specific component by tag name to support process hazard analysis and layers of protection analysis activities 1312.

The client device 10 can include computer instructions to create a report showing specific component information for like components used for risk reduction in the process hazard analysis and layers of protection analysis for the facility 1313.

The client device 10 can include computer instructions to create a recommendations log from the process hazard analysis and layers of protection analysis studies 1314.

The client device 10 can include computer instructions to allow users to search the recommendations log based on: tag name, facility, module, area, safety instrumented functions name, or process hazard analysis node number 1315.

The client device 10 can include computer instructions to allow calculations that allow users to compare at least two possible architectures for a safety instrumented function 1316.

The client device 10 can include computer instructions that allow users to create copies of a first possible architecture and make modifications of the first possible architecture 1317.

The client device 10 can include computer instructions that allow users to change which of the possible architectures is currently marked for use 1318.

The client device 10 can include computer instructions to allow users to import data for an existing facility asset management system to populate a component library in the data storage 1319.

The client device 10 can include the component library 1320.

The client device 10 can include computer instructions to create a report identifying deviations between the facility asset management system of the facility and the imported data in the data storage 1321.

The client device 10 can include computer instructions to allow users to edit cause and effect documents, and allow the users to add cause and effect documents not used in the safety integrity level calculations 1322.

The client device 10 can include computer instructions to allow users to create protections layers not used in layers of protection analysis or the safety integrity level calculations 1323.

The client device 10 can include computer instructions to enter effects as additional actions 1324.

The client device 10 can include computer instructions to allow users to view reports of project status 1325.

The client device 10 can include computer instructions to generate facility acceptance tests using a software model of physical and functional specifications 1326.

The client device 10 can include a software model of physical and functional specifications 1327.

The client device 10 can include computer instructions to generate site acceptance tests using the software model of physical and functional specifications 1328.

The client device 10 can include computer instructions to generate functional test plans for each safety instrumented function of the instrumented protective function 1329.

The client device 10 can include computer instructions to generate a critical alarm list including risk ranking of hazards to which alarms applies 1330.

The client device 10 can include computer instructions to generate a report of test performance for critical alarms 1331.

The client device 10 can include computer instructions to generate a report showing impact of bypassing on a risk gap being opened by placing equipment in bypass 1332.

In one or more embodiments, the client device 10 can include computer instructions to categorize failures form failure rate analysis and provide statistically analyzed failure rates to be used in safety integrity level calculations 1333.

The client device 10 can include computer instructions to allow users to select which set of reliability data they want to use 1334. For example, the users can select from data stored in a reliability library 1335, data collected from the facility and analyzed by failure rate analysis, or user entered data.

The client device 10 can include computer instructions and system architecture to support management of change (MOC) of data records 1336.

For example, the client device 10 can support "asbuilt" or "master records" remaining untouched while "project" copies of records can be edited and manipulated by users. Each edited record can be checked, approved, and then moved to "asbuilt" by qualified users. Qualified users can include users with sufficient permissions and roles tied to their respective login indicating that they can be able to perform the check and approve activities. Previous "asbuilt" versions of records can be archived to maintain a revision history.

The client device 10 can include computer instructions that permit a user to change any one component, one assembly, one assembly group, or combinations thereof or the voting instructions of a tag based software model 1338.

The client device 10 can include computer instructions that provide a connection to tag based assets of the facility that can allow transfer of data from tag based assets to the data storage associated with the processor 1340.

The client device 10 can include computer instructions to use relationship tables and libraries to form a cause and effect report 1342.

Figure 14:
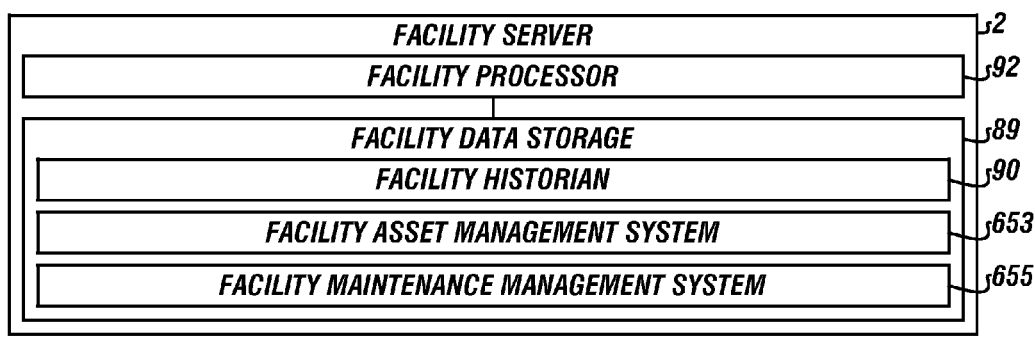
FIG. 14 depicts a facility server according to one or more embodiments.

FIG. 14 is an embodiment of a facility server.

The facility server 2 can include a facility data storage 89 and a facility processor 92. In one or more embodiments, the facility data storage 89 and the facility processor can be connected.

The facility data storage 89 can include the facility historian 90, the facility asset management system 653, and the facility maintenance management system 655.

The system can include computer instructions to use the relationship tables and update a facility historian 90. The system can use the relationship tables to match components to actual real world components in a facility historian 90, wherein the matching of components matches, mean time to repair in the SIL calculation compared to actual unavailability time recorded by the facility historian.

For example, a mean time to repair for PS-120 reported in data storage as 72 hours when matched to the actual unavailability time can be 14 days according to the facility historian 90.

In one or more embodiments, the facility historian can be connected or in communication with the network.

The facility asset management system 653 and the facility maintenance management system 655 can be used to match components with the computer generated safety instrumented system.

The facility asset management system 653 and the facility maintenance management system 655 can be used with computer instructions 76, in FIG. 10B, to match asset identifiers from the component library for a facility to determine: failure rates in the safety integrity level calculations compared to actual failure rates recorded by the facility asset management system 653 or a facility maintenance management system 655; test intervals in the safety integrity level calculations compared to actual test intervals recorded by the facility asset management system 653 or the facility maintenance management system 655; or trip points of parameters for each assembly compared to trip points recorded by the facility asset management system or the maintenance management system.

The computer instructions 91, shown in FIG. 10B, can use the relationship tables to match components from the component library for a facility to components in the facility historian 90 using the asset identifier 339 from the component library and recording the matched components, wherein the matching of components additionally validates a mean time to repair in the safety integrity level calculation as compared with actual unavailability time calculated by the facility historian.

While these embodiments have been described with emphasis on the embodiments, it should be understood that within the scope of the appended claims, the embodiments might be practiced other than as specifically described herein.

What is claimed is:

1. A system to provide a test plan to facility owners to validate at least one instrumented protective function in a real world model, and wherein the system comprises:
   a. a processor;
   b. a data storage connected to the processor that engages a network to communicate with at least one client device having a user; and
   c. a computer generated safety instrumented system model for managing a process safety lifecycle for a safety instrumented system in a facility, wherein the computer generated safety instrumented system model comprises:
      i. computer instructions in the data storage forming a component library for the facility;
      ii. computer instructions in the data storage forming an assembly library for the facility with each assembly having a test interval specification;
      iii. computer instructions in the data storage forming a test plan template library with tasks having at least one step for testing individual assemblies, testing assembly parameters, testing assembly groups, and combinations thereof, within an instrumented protective function;
      iv. computer instructions in the data storage forming the assembly-component relationship table, wherein the component library and the assembly library enable the assembly-component relationship table to depict a relationship between one of the assemblies and at least one component and to provide a purpose for each component in each assembly;
      v. computer instructions forming an assembly group library for the facility in the data storage;
      vi. computer instructions to form an assembly group-assembly relationship table in the data storage, wherein the assembly group library and the assembly library enable the assembly group-assembly relationship table to depict a relationship between at least one assembly group and at least one assembly and to provide a parameter for each assembly;
      vii. computer instructions forming an instrumented protective functions library for the facility in the data storage, wherein the instrumented protective functions library comprises preference selections for each instrumented protective function in the instrumented protective functions library;
      viii. computer instructions to form an instrumented protective function-assembly group relationship table in the data storage, wherein the instrumented protective function library and the assembly groups library enable the instrumented protective function-assembly group relationship table to depict a relationship between at least one instrumented protective function and at least one assembly group, forming a safety instrumented system with at least one instrumented protective function creating a real world model of the instrumented protective function;
      ix. computer instructions in the data storage to assign a tag name to at least one component identifier and to assign at least one voting instruction to at least one assembly identifier and at least one assembly group identifier, creating the computer generated safety instrumented system model with a functional specification and a physical specification for all of the instrumented protective functions for the facility in real time;

x. computer instructions in the data storage to execute safety integrity level calculations using:
1. the safety integrity level calculation engine;
2. each component of the facility with a tag name with voting instructions;
3. the functional specifications for each instrumented protective function;
4. the physical specifications for each instrumented protective function;
5. a user entered assumption for each instrumented protective function; and
wherein the safety integrity level calculations identify and verify that the safety integrity level calculations are met simultaneously for each instrumented protective function:
(i) an average probability of failure on demand for the instrumented protective function; and
(ii) architectural constraint requirements for the instrumented protective function; and
wherein the system using the computer instructions in the data storage in real time, compares actual safety integrity levels achieved at the facility determined by the computer generated safety instrumented system model to user specified safety integrity levels and identifies gaps between an actual safety integrity levels and user specified safety integration levels for the facility; and xi. computer instructions to generate a test plan template from the test plan template library wherein the generated test plan template comprises a collection of tasks and steps for an assembly, an assembly parameter, an assembly group, or combinations thereof;

xii. computer instructions to match the generated test plan template to an assembly type using at least one of a plurality of assembly types stored in the assembly library;

xiii. computer instructions to designate preferences for assembly level testing or assembly group level testing, or combinations thereof, for each instrumented protective function using the generated test plan template and the instrumented protective functions library for the facility;

xiv. computer instructions to generate a test plan using the generated test plan template, the designated preferences for assembly level testing or assembly group level testing, or combinations thereof, and the assembly type, the assembly, the assembly parameter, the assembly group, or combinations thereof;

xv. computer instructions to generate a test schedule for each designated preference using the generated test plan; and xvi. computer instructions to generate a look ahead forecast for preset periods of time for each designated preference or groups of designated preferences in the test schedule.

2. The system of claim 1, further comprising a document library comprises a member of the group comprising:
a. a document identifier that provide a link to the document library;
b. document types;
   i. cause and effect diagram document;
   ii. safety requirements specification document;
   iii. layer of protective analysis document types;
   iv. test plan procedures;
   v. safety integrity level calculation modeling files;
   vi. override risk assessment; and
   vii. safety integrity level calculation, or combinations thereof;
c. document names; and
d. document descriptions.

3. The system of claim 1, wherein the data storage comprises a library of publications viewable for compliance comprises:
a. statutes (US CODE);
b. industry standards (IEC codes);
c. national regulation (CFR); and
d. business owner specific policies; and
e. combinations thereof.

4. The system of claim 1, wherein the component library comprises:
a. a name representing an instance of equipment type;
b. a process description;
c. an equipment type;
d. the component identifier for components in the assembly for identifying the component in the system;
e. a component type describes a specific installation and operation at that specific installation;
f. a tag name for identifying the instrument in a drawing;
g. an asset identifier for identifying the instrument with a third party system to track the instrument location for maintenance, additional use, cost of ownership, and for use in inventory management; and
h. a means for reconciling identifier for component lists with third party software related to the instrument; and
i. combinations thereof.

5. The system of claim 4, wherein an assembly component relationship table comprises an assembly identifier, the component identifier, a purpose, and the logic solver.

6. The system of claim 1, wherein the assembly library comprises:
a. a name of the assembly representing at least one component;
b. a process description of the assembly (separator pressure);
c. an assembly type describes a specific installation and operation at that specific installation;
d. a location of the assembly in a facility;
e. the assembly identifier for the assembly for use in the library;
f. an assembly probability of failure on demand (calculated PFD) as calculated by a safety integrity level calculation engine;
g. an assembly based actuator to permit overrides of the safety integrity level calculation engine in the system and allow manual entry of a probability of failure for that assembly;
h. the document identifier that provide a link to the document library;
i. an overt fault status that describes a state to transition an assembly to when an overt fault is recognized; and
j. combinations thereof.

7. The system of claim 1, wherein the logic solver library comprises:
a. a logic solver identifier (such as or null);
b. a logic solver location;
c. a name of a logic solver;
d. a description of the logic solver;

e. a probability of failure on demand for the logic solver; and f. a test interval to define a required test.

8. The system of claim 1, wherein the assembly group library comprises:
   a. an assembly group identifier;
   b. a name of each assembly group;
   c. the voting instruction of each assembly group;
   d. a user entered assumption for an assembly group;
   e. a calculated assembly group failure on demand;
   f. an assembly group type; and
   g. the document identifier associated with assembly group, and combinations thereof.

9. The system of claim 1, wherein the instrumented protective function library comprises:
   a. a protective layer identifier;
   b. an instrumented protective function name;
   c. an input group voting instruction;
   d. an output group voting instruction;
   e. a calculated instrumented protective function probability of failure on demand; and
   f. instrumented protective function based actuator to permit override of the instrumented protective function safety integrity level calculation engine in the system and allow manual entry of a probability of failure for that instrumented protective function.

10. The system of claim 1, wherein the assembly group-assembly relationship table comprises:
    a. the assembly group identifier;
    b. the assembly identifier;
    c. an assembly parameter identifier;
    d. an assembly parameter value; and
    e. a parameter unit.

11. The system of claim 1, wherein the instrumented protective function-assembly group relationship table comprises:
    a. an instrumented protective function identifier;
    b. the assembly group identifier;
    c. an instrumented protective function to assembly group relationship identifier; and
    d. an indication that an assembly group is functioning as additional action not included in the instrumented protective function safety integrity level calculation engine.

12. The system of claim 1, further comprising computer instructions to provide a location tree for each component in the model, each instrumented protective function, each assembly, each assembly group and combinations thereof.

13. The system of claim 12, further comprising computer instructions to provide a page identifier in the safety instrumented system model, to display the module of the safety instrumented system model that a user is within at any time, which will provide a hierarchy of modules associated with the user location.

14. The system of claim 1, further comprising computer instructions that permit the user to edit or replace any one component, assembly, voting instructions for an assembly, assembly group, an instrumented protective function or combinations thereof.

15. The system of claim 1, further comprising computer instructions that permit a user to change any one component or the voting instructions.

16. The system of claim 1, further comprising computer instructions that provide a connection to tag based assets of the facility.

17. The system of claim 1, further comprising computer instructions to present a logic solver as a component of the instrumented protective function to execute the voting instructions to carry out the functions of the instrumented protective function and to carry out instructions to permit a user to edit or replace any logic solver.

18. The system of claim 1, further comprising computer instructions to use the relationship tables to form a cause and effect report for a user for each instrumented protective function.

19. The system of claim 1, further comprising computer instructions for instructing the processor to generate a test plan template from a plurality of test plan templates in a test plan template library in the data storage, wherein the test plan template library comprises tasks and steps for verifying the functional specifications, physical specifications and a member of the group consisting of: an assembly, assembly parameters, an assembly group, an instrumented protective function, or combinations thereof.

20. The system of claim 19, wherein the test plan template comprises a plurality of tasks in support of process safety lifecycle management, and each task comprises at least one instructional step for test plan execution.

21. The system of claim 1, further comprising computer instructions to use to match the asset identifier from the component library for a facility to components used in a facility asset management system, and to match components used in the facility maintenance management system, and combinations thereof; wherein the matching of components matches:
    a. failure rates in the safety integrity level calculations compared to actual failure rates recorded by the facility asset management system or a facility maintenance management system;
    b. test intervals in the safety integrity level calculations compared to actual test intervals recorded by the facility asset management system or the facility maintenance management system; or
    c. trip points of parameters for each assembly compared to trip points recorded by the facility asset management system or the maintenance management system.

22. The system of claim 21, further comprising computer instructions to use the relationship tables to match components from the component library for a facility to components in a facility historian using the asset identifier from the component library and recording the matched components, wherein the matching of components additionally validates a mean time to repair in the safety integrity level calculation as compared with actual unavailability time calculated by the facility historian.

23. The system of claim 1, further comprising computer instructions to update all instances of at least one component, assembly, assembly group, instrumented protective function, or combinations thereof, simultaneously.

24. The system of claim 1, further comprising using computer instructions to generate a safety requirements specification for the safety instrumented system and computer instructions allowing a user to edit the safety requirements specification for the safety instrumented system.

25. The system of claim 1, further comprising computer instructions to support management of change (MOC) for data records in the system by supporting "master" records, being untouched while "project" copies of the data records are edited and manipulated by users, which operation is also known as "sandbox."

26. The system of claim 25, further comprising computer instructions which permit a user to check each edited record, mark each record as checked, approved, and then move the checked and approved record to "master" records by a qualified users.

27. The system of claim 1, further comprises computer instructions to allow users to enter data and perform analysis to support process hazard analysis and layers of protection analysis.

28. The system of claim 1, further comprising computer instructions to connect data of the process hazard analysis and layers of protection analysis to the safety integrity level calculations.

29. The system of claim 1, further comprising computer instructions to support analysis of protection layers to be applied to reduce probability of a hazardous event occurring.

30. The system of claim 1, further comprising computer instructions to include analysis to calculate the safety integrity level calculations required to reduce risk to a target level.

31. The system of claim 1, further comprising computer instructions to allow users to enter tolerable risk criteria for the facility.

32. The system of claim 1, further comprising computer instructions to support revision tracking and impact reporting on proposed changes.

33. The system of claim 32, further comprising computer instructions to allow users to enter proposed changes and view impact reports prior to approving changes.

34. The system of claim 1, further comprising computer instructions to allow users to enter initiating causes captured in the facility that require the safety instrumented systems or other protection layers to respond.

35. The system of claim 1, further comprising computer instructions to allow users to manage imports of process hazard analysis and layers of protection analysis from other tools.

36. The system of claim 1, further comprising computer instructions to analyze the safety integrity level calculations and automatically identify optimum proof test intervals to meet the safety integrity level calculations.

37. The system of claim 1, further comprising computer instructions to allow users to enter a specific component for use in an instrumented protective function during design phase of a project.

38. The system of claim 1, further comprising computer instructions to allow users to search for the specific component by tag name to support process hazard analysis and layers of protection analysis activities.

39. The system of claim 1, further comprising computer instructions to create a report showing specific component information for like components used for risk reduction in the process hazard analysis and layers of protection analysis for the facility.

40. The system of claim 1, further comprising computer instructions to create a recommendations log from the risk assessment.

41. The system of claim 40, further comprising computer instructions to allow users to search the recommendations log based on: tag name, facility, module, area, safety instrumented functions name, or process hazard analysis node number.

42. The system of claim 1, further comprising computer instructions to allow calculations that allow users to compare at least two possible architectures for a safety instrumented function.

43. The system of claim 42, further comprising computer instructions that allow users to create copies of a first possible architecture and make modifications of the first possible architecture.

44. The system of claim 42, further comprising computer instructions that allow users to change which of the possible architectures is currently marked for use.

45. The system of claim 1, further comprising computer instructions to allow users to import data for an existing facility asset management system to populate a component library in the data storage.

46. The system of claim 1, further comprising computer instructions to create a report identifying deviations between the facility asset management system of the facility and the imported data in the data storage.

47. The system of claim 1, further comprising computer instructions to allow users to edit cause and effect documents, and allow the users to add cause and effect documents not used in the safety integrity level calculations.

48. The system of claim 1, further comprising computer instructions to allow users to create protections layers not used in layers of protection analysis or the safety integrity level calculations.

49. The system of claim 1, further comprising computer instructions to enter effects as additional actions.

50. The system of claim 1, further comprising computer instructions to allow users to view reports of project status.

51. The system of claim 1, further comprising computer instructions to generate facility acceptance tests using a software model of physical and functional specifications.

52. The system of claim 1, further comprising computer instructions to create a plurality of reports of:
   a. test plans for each instrumented protective function;
   b. test scheduling for each instrumented protective function;
   c. a look ahead forecast for each instrumented protective function; and
   d. combinations thereof.

53. The system of claim 1, further comprising computer instructions to generate a critical alarm list including risk ranking of hazards to which alarms applies.

54. The system of claim 53, further comprising computer instructions to generate a report of test performance for critical alarms.

55. The system of claim 1, further comprising computer instructions to generate a report showing impact of bypassing on a risk gap being opened by placing equipment in bypass.

56. The system of claim 1, wherein the computer instructions 20 match the generated test plan template to an assembly type by selecting one generated test plan template name for each assembly type in the assembly library.

57. The system of claim 1, wherein the computer instructions for designating preferences 389 for assembly level testing, assembly group level testing, and combinations thereof, for each instrumented protective function using the test plan template and the instrumented protective functions library perform the steps comprising:
   a. selecting an instrumented protective function from the instrumented protective functions library;
   b. selecting either an assembly preference or an assembly group level preference from the instrumented protective functions library;
   c. storing the selected assembly preference or assembly group level preference in the instrumented protective functions library with a preference identifier; and
   d. matching individual assemblies, assembly groups, and combinations thereof, from the assembly library, assembly group library or combinations thereof, as filtered by the selected instrumented protective function to each preference identifier.

58. The system of claim 57, wherein the computer instructions to generate a test plan perform the steps comprises:

a. selecting an instrumented protective function from the instrumented protective functions library forming a selected instrumented protective function;
b. matching a selected instrumented protective function to preference identifiers using the instrumented protective functions library;
c. matching a preference identifier to each assembly, assembly parameter, assembly group, and combinations thereof, using the assembly library;
d. matching each assembly, assembly parameter, assembly group and combinations thereof, to an assembly type using the assembly library;
e. matching each assembly type to a test plan template using both the assembly type library and the test plan template library; and
f. matching designated preferences to the test plan template to generate the test plan.

59. The system of claim 1, wherein the computer instructions to generate a test schedule for each designated preference perform the steps comprising:
a. selecting an instrumented protective function from the instrumented protective functions library using a location;
b. selecting either an assembly preference or assembly group level preference from the instrumented protective functions library;
c. selecting a date for testing a selected preference;
d. selecting a recurrence interval for repeating the testing of selected preferences; and
e. saving preferences for each selected instrumented protective function with location and generating a test schedule depicting the dates and intervals.

60. The system of claim 59, wherein the computer instructions to generate a look ahead forecast for the test schedule with an identified location and all instrumented protective functions for the location perform the steps comprising:
a. identifying a location;
b. identifying a start date and an end date and creating a forecast window; and
c. identifying all dates in the test schedule and all reoccurrence dates in the test schedule for testing each assembly, each assembly parameter, each assembly group, and combinations thereof, at the location and within the forecast window.

* * * * *